(12) United States Patent
Bratton et al.

(10) Patent No.: US 7,953,587 B2
(45) Date of Patent: May 31, 2011

(54) METHOD FOR DESIGNING AND OPTIMIZING DRILLING AND COMPLETION OPERATIONS IN HYDROCARBON RESERVOIRS

(75) Inventors: Tom Bratton, Littleton, CO (US); Randy Koepsell, Highlands Ranch, CO (US); Tom Olsen, Paker, CO (US); Adam Donald, Highlands Ranch, CO (US)

(73) Assignee: Schlumberger Technology Corp, Houston, TX (US)

( * ) Notice: Subject to any disclaimer, the term of this patent is extended or adjusted under 35 U.S.C. 154(b) by 869 days.

(21) Appl. No.: 11/818,411

(22) Filed: Jun. 14, 2007

(65) Prior Publication Data

US 2007/0294034 A1    Dec. 20, 2007

Related U.S. Application Data

(60) Provisional application No. 60/814,482, filed on Jun. 15, 2006, provisional application No. 60/831,870, filed on Jul. 19, 2006.

(51) Int. Cl.
*G06G 7/48*    (2006.01)

(52) U.S. Cl. .......................................................... 703/10
(58) Field of Classification Search .................. 703/1, 6, 703/9, 10
See application file for complete search history.

(56) References Cited

U.S. PATENT DOCUMENTS

| | | | |
|---|---|---|---|
| 6,829,570 B1 * | 12/2004 | Thambynayagam et al. | 703/10 |
| 6,873,267 B1 * | 3/2005 | Tubel et al. | 340/853.3 |
| 7,359,844 B2 * | 4/2008 | Sung et al. | 703/10 |
| 2002/0147574 A1 * | 10/2002 | Ong et al. | 703/10 |
| 2004/0122640 A1 * | 6/2004 | Dusterhoft | 703/10 |
| 2005/0171698 A1 * | 8/2005 | Sung et al. | 702/9 |
| 2006/0095240 A1 * | 5/2006 | Elisabeth et al. | 703/10 |
| 2007/0079962 A1 * | 4/2007 | Zazovsky et al. | 166/264 |

\* cited by examiner

*Primary Examiner* — Paul L Rodriguez
*Assistant Examiner* — Aniss Chad
(74) *Attorney, Agent, or Firm* — Robert P. Lord; Cuong L. Nguyen; Bryan P. Galloway

(57) ABSTRACT

A method is disclosed for generating a wellsite design, comprising: designing a workflow for an Earth Model; building an initial Earth Model based on the workflow adapted for modeling drilling and completions operations in a hydrocarbon reservoir; calibrating the initial Earth Model thereby generating a calibrated Earth Model; and generating the wellsite design using the calibrated Earth Model.

26 Claims, 15 Drawing Sheets

METHOD FOR DESIGNING AND OPTIMIZING DRILLING AND COMPLETION OPERATIONS IN HYDROCARBON RESERVOIRS

CROSS REFERENCE TO RELATED APPLICATIONS

This application is a Utility application of: (1) prior Provisional application Ser. No. 60/814,482 filed Jun. 15, 2006, and (2) prior Provisional application Ser. No. 60/831,870 filed Jul. 19, 2006.

BACKGROUND OF THE INVENTION

This subject matter disclosed in this specification relates to techniques for designing wellbore operations. In particular, this specification discloses a method and associated system and program storage device and computer program for developing earth models for designing drilling and/or completions operations for a wellbore penetrating a subterranean formation.

Many reservoirs did do not have sufficient permeability to be commercial unless a hydraulic fracture was is created that connected more of the reservoir to the wellbore. Permeability is "the ability, or measurement of a rock's ability, to transmit fluids, typically measured in darcies or millidarcies." (Schlumberger Oilfield Glossary.) In addition, the hydraulic fracture (or other completion pathway, such as the perforation) also needed needs to have a sufficient permeability permeability in order for the reservoir to be commercial. (The term "conductivity" is often used to describe the permeability of a fracture.) As the search for hydrocarbons continues and the price of hydrocarbon increases, technologies are developing that allow commercial production from reservoirs with 'micro Darcy' permeability and lower. However, commercial development is often limited by insufficient permeability of the completion pathway. This specification discloses a 'workflow that models and optimizes drilling and completion operations in hydrocarbon reservoirs', where the reservoirs may or may not be naturally fractured. That is, the aforementioned 'workflow that optimizes drilling and completion operations in hydrocarbon reservoirs' will characterize or determine a set of 'properties of the reservoir' with enough clarity in order to design one or more 'drilling and completion operations', such that the 'drilling and completion operations' will minimize the damage to the hydrocarbon reservoir, minimize the damage to the completion pathway, maximize the production rate, and maximize the ultimate recovery.

SUMMARY OF THE INVENTION

One aspect of the present invention involves a method of generating a wellsite design, comprising: designing a workflow for an Earth Model; building an initial Earth Model based on the workflow adapted for modeling drilling and completions operations in a hydrocarbon reservoir; calibrating the initial Earth Model thereby generating a calibrated Earth Model; and generating the wellsite design using the calibrated Earth Model.

A further aspect of the present invention involves a computer program adapted to be executed by a processor, the computer program, when executed by the processor, conducting a process for generating a wellsite design, the process comprising: designing a workflow for an Earth Model; building an initial Earth Model based on the workflow adapted for modeling drilling and completions operations in a hydrocarbon reservoir; calibrating the initial Earth Model thereby generating a calibrated Earth Model; and generating the wellsite design using the calibrated Earth Model.

A further aspect of the present invention involves a program storage device readable by a machine tangibly embodying a set of instructions executable by the machine to perform method steps for generating a wellsite design, the method steps comprising: designing a workflow for an Earth Model; building an initial Earth Model based on the workflow adapted for modeling drilling and completions operations in a hydrocarbon reservoir; calibrating the initial Earth Model thereby generating a calibrated Earth Model; and generating the wellsite design using the calibrated Earth Model.

A further aspect of the present invention involves a method of generating a wellsite design, the wellsite design relating to a drilling and completions operation in a hydrocarbon reservoir, comprising: designing a workflow for an Earth Model; building an initial Earth Model based on the workflow, the initial Earth Model including one or more workflow models, the workflow models of the initial Earth Model being operatively interconnected in a particular manner in order to optimize the drilling and completions operation in the hydrocarbon reservoirs, the one or more workflow models of the initial Earth Model optimizing the drilling and completions operations in the hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir; calibrating the initial Earth Model thereby generating a calibrated Earth Model, the calibrating step including (a) observing wellsite conditions thereby generating observations, (b) performing simulations to thereby generate predictions, (c) comparing the observations with the predictions, (d) accepting the initial Earth Model, thereby generating a calibrated Earth Model, on the condition that the observations agree with the predictions, (e) adjusting the initial Earth Model on the condition that the observations do not agree with the predictions; and (f) repeating steps (b) through (e) until the observations agree with the predictions; and generating the wellsite design using the calibrated Earth Model, the step of generating the wellsite design including obtaining the calibrated Earth Model, defining operating constraints for a wellsite operation, and designing and generating the wellsite design using the calibrated Earth Model and the operating constraints.

A further aspect of the present invention involves a computer program adapted to be executed by a processor, the computer program, when executed by the processor, conducting a process for generating a wellsite design, the wellsite design relating to a drilling and completions operation in a hydrocarbon reservoir, the process comprising: designing a workflow for an Earth Model; building an initial Earth Model based on the workflow, the initial Earth Model including one or more workflow models, the workflow models of the initial Earth Model being operatively interconnected in a particular manner in order to optimize the drilling and completions operation in the hydrocarbon reservoirs, the one or more workflow models of the initial Earth Model optimizing the drilling and completions operations in the hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir; calibrating the initial Earth Model thereby generating a calibrated Earth Model, the calibrating step including (a) observing wellsite conditions thereby generating observations, (b) performing simulations to thereby generate predictions, (c)

comparing the observations with the predictions; (d) accepting the initial Earth Model, thereby generating a calibrated Earth Model, on the condition that the observations agree with the predictions, (e) adjusting the initial Earth Model on the condition that the observations do not agree with the predictions, and (f) repeating steps (b) through (e) until the observations agree with the predictions; and generating the wellsite design using the calibrated Earth Model, the step of generating the wellsite design including obtaining the calibrated Earth Model, defining operating constraints for a wellsite operation, and designing and generating the wellsite design using the calibrated Earth Model and the operating constraints.

A further aspect of the present invention involves a system adapted for generating a wellsite design, comprising: apparatus adapted for designing a workflow for an Earth Model; apparatus adapted for building an initial Earth Model based on the workflow, said initial Earth Model being adapted for modeling drilling and completions operations in a hydrocarbon reservoir; apparatus adapted for calibrating the initial Earth Model thereby generating a calibrated Earth Model; and apparatus adapted for generating the wellsite design using the calibrated Earth Model.

A further aspect of the present invention involves a system adapted for generating a wellsite design, the wellsite design relating to a drilling and completions operation in a hydrocarbon reservoir, comprising: apparatus adapted for designing a workflow for an Earth Model; apparatus adapted for building an initial Earth Model based on the workflow, the initial Earth Model including one or more workflow models, the workflow models of the initial Earth Model being operatively interconnected in a particular manner in order to optimize the drilling and completions operation in the hydrocarbon reservoirs, the one or more workflow models of the initial Earth Model optimizing the drilling and completions operations in the hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir; calibrating apparatus adapted for calibrating the initial Earth Model thereby generating a calibrated Earth Model, the calibrating apparatus including, (a) apparatus adapted for observing wellsite conditions thereby generating observations, (b) apparatus adapted for performing simulations to thereby generate predictions, (c) apparatus adapted for comparing the observations with the predictions, (d) apparatus adapted for accepting the initial Earth Model, thereby generating a calibrated Earth Model, on the condition that the observations agree with the predictions, (e) apparatus adapted for adjusting the initial Earth Model on the condition that the observations do not agree with the predictions, and (f) apparatus adapted for repeating the (b) through the (e) until the observations agree with the predictions; and generating apparatus adapted for generating the wellsite design using the calibrated Earth Model, the generating apparatus including apparatus adapted for obtaining the calibrated Earth Model, apparatus adapted for defining operating constraints for a wellsite operation, and apparatus adapted for designing and generating the wellsite design using the calibrated Earth Model and the operating constraints.

Further scope of applicability will become apparent from the description and detailed description presented hereinafter. It should be understood, however, that the description and detailed description and specific examples set forth below are given by way of illustration only, since various changes and modifications within the spirit and scope of the 'workflow that optimizes drilling and completion operations in hydrocarbon reservoirs', as described and claimed in this specification, will become obvious to one skilled in the art from a reading of the following description and detailed description.

BRIEF DESCRIPTION OF THE DRAWINGS

A full understanding will be obtained from the detailed description presented hereinbelow, and the accompanying drawings which are given by way of illustration only and are not intended to be limitative to any extent, and wherein.

DESCRIPTION

Figure 1:
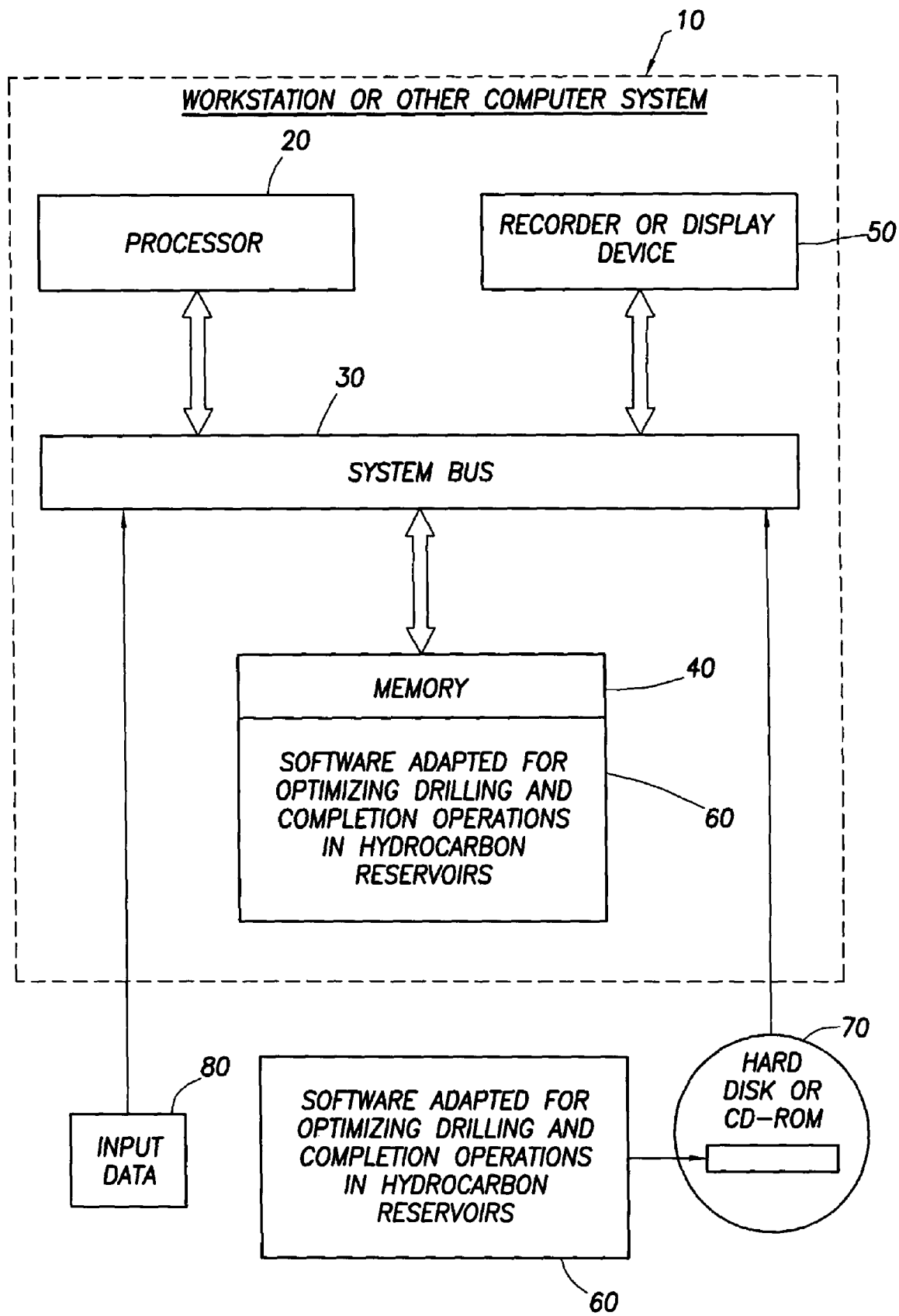
FIG. 1 illustrates a computer system adapted for storing a 'Software adapted for optimizing Drilling and Completions Operations in Hydrocarbon reservoirs'.

Presently preferred embodiments of the invention are shown in the above-identified figures and described in detail below. In describing the preferred embodiments, like or identical reference numerals are used to identify common or similar elements. The figures are not necessarily to scale and certain features and certain views of the figures may be shown exaggerated in scale or in schematic in the interest of clarity and conciseness.

Wellbores are drilled to locate and produce hydrocarbons. A downhole drilling tool with a bit at and end thereof is advanced into the ground to form a wellbore. Once the wellbore is drilled, the drilling tool is removed and the well is completed by cementing a steel tubing within the well. Fluids are then removed from the formation and transported through the wellbore to the surface.

The drilling and completion operations are often performed according to various operating parameters, such as wellbore pressures, drilling speeds, etc. The operating parameters used to drill and complete the well may be manipulated to optimize the wellbore operations. Other parameters, such as wellsite parameters, may also affect the drilling and/or completion operations, as well as the ability to produce fluids from the well. Such wellsite parameters may include, for example, formation parameters, such as permeability and rock strength, and/or surface parameters, such as mud pressures. The wellsite parameters may also be manipulated to optimize wellsite operations, for example, by increasing wellbore pressure to create hydraulic fractures to facilitate fluid flow.

In order to determine the desired parameters for generating optimum wellsite performance, it is often desirable to predict wellbore operations. Such predictions may be made, for example, by using various simulation and/or modeling techniques. Such simulations may be performed to provide an estimate of the performance of the wellbore, or to evaluate wellbore conditions.

Various modeling techniques have been developed for predicting certain wellbore operations, such as hydrocarbon production. One such technique involves a scientific method where a theory or model is proposed and refined until the model accurately predicts the results of an experiment or process. This method involves a workflow of design, execute and evaluate. Another technique involves an integrated earth model (EM) that is used in conjunction with oilfield simulators and is also based on workflow. Another technique involves a mechanical earth model (MEM) for use with geophysical applications. Examples of modeling techniques are described in "Advancements in Acoustic Techniques for Evaluation Open Natural Fractures", *SPWLA 47th Annual Logging Symposium*, Jun. 4-7, 2006; "Near-wellbore Alteration and Formation Stress Parameters using Borehole Sonic Data", *SPE* 94841, October 2005; "Watching Rocks Change—Mechanical Earth Modeling", by Ali et al., *Oilfield Review*, Summer 2003, p. 22-39; "Logging-While Drilling Images for Geomechanical, Geological and Petrophysical Interpretations", Paper JJJ, *SPWLA 40th Annual Logging Symposium*, Oslo, Norway, 1999; and "Using Acoustic Anisotropy", 41st *SPWLA Symposium*, June 2000.

While various modeling techniques have been developed, there remains a need for modeling techniques capable of accurately predicting the outcome of wellsite operations. Existing modeling techniques typically provide a limited set of predictions that can optimize wellbore operations. Such modeling techniques often fail to consider parameters that affect the quality of the model. It is desirable to have modeling systems capable of considering a wide variety of parameters that can affect the wellsite operation.

Fractures and stress are examples of formation parameters that can affect wellsite operations. Fractures extending from the wellbore and into the formations surrounding the wellbore can often be used to increase permeability to facilitate the flow of the formation fluid. These fractures may be naturally occurring or man-made. Natural fractures are pre-existing breaks in the formation. Man-made fractures are often hydraulically created to extend from the wellbore and into the formations surrounding the wellbore.

In some cases, man-made fractures are created intentionally by increasing wellbore pressure. Such a wellbore operation may be executed to increase production. In other cases, such as where a low fracture gradient exists, the cementing process performed during completions often induces man-made fractures by forcing cement into the surrounding formation. Where natural fractures exist, the cementing process may also force cement into the surrounding formation thereby inducing an expansion of the natural fractures. Completing a well involves activities performed after the well has been drilled to total depth, has been evaluated, such as through logging, for production potential, and is being readied for production. Completion activities may include but is not limited to cementing (such as cementing the casing in place for zonal isolation and well integrity), perforating the well, stimulation (including but not limited to matrix acidizing, fracture acidizing, hydraulic fracturing), horizontal wells, multilaterals, perforating, jetting, and installation of production equipment into the well, as well as sand management and water management. The induced fractures caused by the completions and/or cementing jobs can damage the permeabilities provided by natural fractures. Natural fractures may also be damaged with direct cement injection at the wellbore surface due to a cement hydrostatic pressure greater than reservoir pressure inherent to the fracture. Such induced fractures often drive cement, for example, into the formation such that the reservoir is rendered non-commercial. It may, therefore, be desirable to consider the fractures when designing wellsite operations.

Difficulties have been encountered in developing earth models (EMs) for downstream applications, such as completions operations. Many downhole parameters may not have been considered when designing completions operations. It is often difficult to obtain some desired parameters that can affect models, such as fracture aperture, permeability, fracture spacing, and stresses (e.g., magnitude of in-situ stresses, magnitude of maximum horizontal stresses, etc.) For example, it can be difficult to discriminate between acoustical anisotropy of fractures from those of in-situ stresses or borehole rugosity. Also, various fractures, such as drilling induced, open natural and closed natural fractures, are often difficult to locate and/or distinguish. Even if such parameters can be determined, it is often difficult to generate accurate models and/or design wellsite operations with such parameters.

Techniques for evaluating fractures have been attempted as described, for example, in "Interpretation of Fracturing Pressures", *SPE* 8297, September 1981 and "Mechanical Damage Detection and Anisotropy Evaluation Using Dipole Sonic Dispersion Analysis", 43$^{rd}$ *SPWLA Symposium,* June 2002. Some basic modeling techniques have also been developed using fracturing information. Examples of such hydraulic fracturing simulation and/or modeling techniques are described in US20050236125, US20060015310, US20050115711, and U.S. Pat. No. 6,876,959. While these techniques may consider fractures and provide various modeling capabilities, they typically fail to provide an analytical process for using fracture parameters and/or for providing designs for wellsite operations.

Despite advances made in modeling and fracture analysis, there remains a need to more accurately determine wellsite parameters. There also remains a need to provide models that may be used to design wellsite operations. It is, therefore, desirable to develop models capable of considering parameters, such as natural factures, fracture apertures, fracture density, fracture genesis, fracture orientation, stress orientation, residual forces and other features of fractures, that may impact the wellsite operation. Preferably, workflows capable of characterizing the properties of the reservoir sufficient to design drilling and completion operations are provided. Wellbore operations are preferably designed to minimize damage to the hydrocarbon reservoir and completion pathway, maximizing production rates and/or maximizing hydrocarbon recovery.

It is further desirable that techniques be developed for designing wellbore operations using modeling techniques that take into consideration additional key parameters, such as parameters relating to natural fractures. A desired modeling and design technique preferably includes one or more of the following features, among others: a model having a wide variety of wellsite parameters (such as but not limited to stress, Young's modulus, Poisson's ratio), an expanded model for designing drilling and/or completions operations, a model that can include additional or refined components, a model that can be revised as needed, a model adjustable to wellsite conditions, a model that can integrate evolving conditions, and a method that provides feedback to an operator concerning the model and/or the design.

Referring to FIG. 1, a computer system is illustrated which is adapted to store a 'Software adapted for optimizing drilling and completion operations in hydrocarbon reservoirs'.

In FIG. 1, a workstation, personal computer, or other computer system 10 is illustrated that is adapted for storing a 'Software adapted for optimizing drilling and completion operations in hydrocarbon reservoirs'. The computer system 10 of FIG. 1 includes a Processor 20 operatively connected to a system bus 30, a memory or other program storage device 40 operatively connected to the system bus 30, and a recorder or display device 50 operatively connected to the system bus 30. The computer system 10 of FIG. 1 receives a set of 'Input Data' 80. The 'Input Data' 80 will be discussed in detail later in this specification. The memory or other program storage device 40 stores a 'Software adapted for optimizing drilling and completion operations in hydrocarbon reservoirs' 60. When the Software 60 stored in the memory 40 is executed by the processor 20 of FIG. 1 in response to the 'Input Data' 80, the Software 60 (in conjunction with the processor 20) will practice a 'method or technique adapted for characterizing the properties of a reservoir with enough clarity to design drilling and completion operations that minimize the damage to the hydrocarbon reservoir and completion pathway, maximizes the production rate, and maximizes the ultimate recovery'. The Software 60 of FIG. 1, which is stored in the memory 40 of FIG. 1, can be initially stored on a Hard Disk or CD-Rom 70, where the Hard Disk or CD-Rom 70 is also a 'program storage device'. The CD-Rom 70 can be inserted into the computer system 10, and the Software 60 can be loaded from the CD-Rom 70 and into the memory/program storage device 40 of the computer system 10 of FIG. 1. The Processor 20 will execute the 'Software adapted for optimizing drilling and completion operations in hydrocarbon reservoirs' 60 that is stored in memory 40 of FIG. 1; and, responsive thereto, the Processor 20 will generate an 'output display' that is recorded or displayed on the Recorder or Display device 50 of FIG. 1. The 'output display', which is recorded or displayed on the Recorder or Display device 50 of FIG. 1, would record or display a 'wellsite design(s) based on a calibrated Earth Model (EM), as discussed in this specification. The computer system 10 of FIG. 1 may be a personal computer (PC), a workstation, a microprocessor, or a mainframe. Examples of possible workstations include a Silicon Graphics Indigo 2 workstation or a Sun SPARC workstation or a Sun ULTRA workstation or a Sun BLADE workstation. The memory or program storage device 40 (including the above referenced Hard Disk or CD-Rom 70) is a 'computer readable medium' or a 'program storage device' which is readable by a machine, such as the processor 20. The processor 20 may be, for example, a microprocessor, microcontroller, or a mainframe or workstation processor. The memory or program storage device 40, which stores the 'Software adapted for optimizing drilling and completion operations in hydrocarbon reservoirs' 60, may be, for example, a hard disk, ROM, CD-ROM, DRAM, or other RAM, flash memory, magnetic storage, optical storage, registers, or other volatile and/or non-volatile memory.

Figure 2:
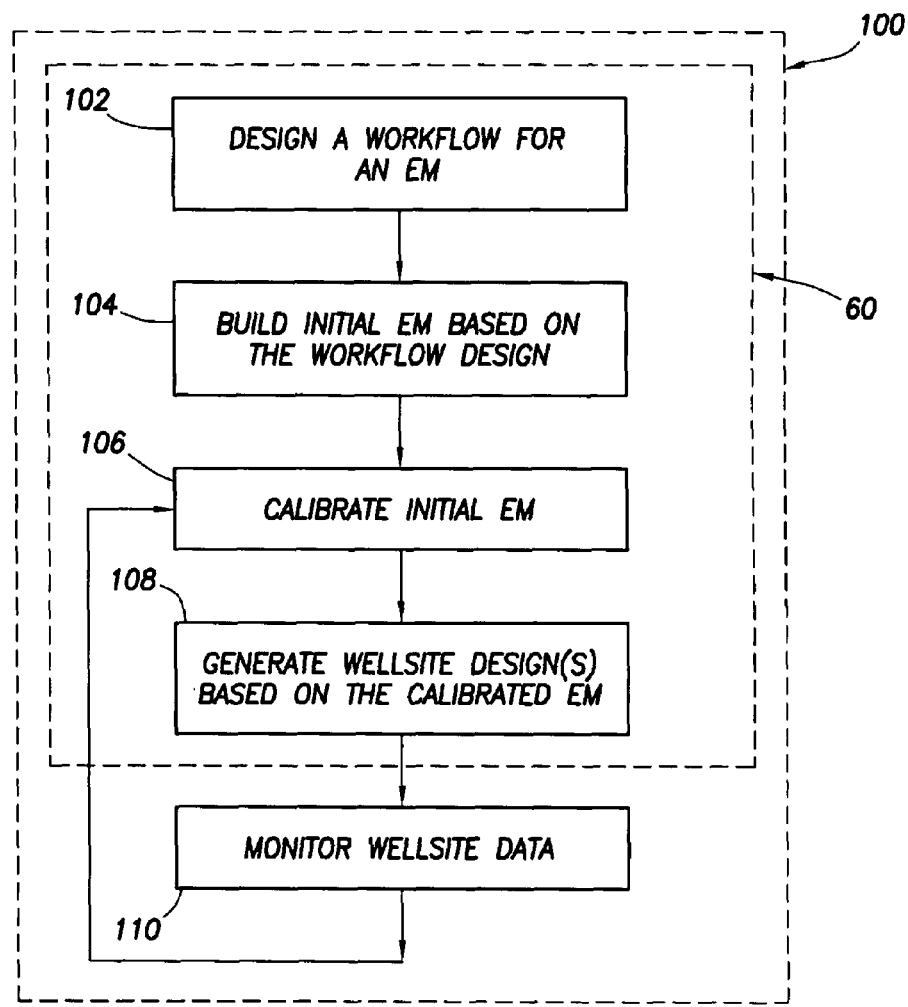
FIG. 2 illustrates a flow chart of the 'Software adapted for Optimizing Drilling and Completions Operations in Hydrocarbon reservoirs' 60 which is stored in the computer system of FIG. 1 and is adapted to 'optimize drilling and completions operations in hydrocarbon reservoirs' by 'characterizing the properties of the reservoir with enough clarity in order to design drilling and completions operations that minimizes the damage to the hydrocarbon reservoir, minimize the damage to the completion pathway, maximize the production rate, and maximize the ultimate recovery of underground deposits of hydrocarbon in the reservoir' and generate a 'wellsite design based on a calibrated Earth Model (EM)' prior to practicing a 'monitor wellsite data' step.

Referring to FIG. 2, a 'method of designing a wellsite operation' 100 is illustrated. In FIG. 2, a flowchart is illustrated which represents the 'Software adapted for optimizing drilling and completion operations in hydrocarbon reservoirs' 60 of FIG. 1. In FIG. 2, the 'method of designing a wellsite operation' 100 includes: (1) a flow chart 60 of the 'Software adapted for Optimizing Drilling and Completions Operations in Hydrocarbon reservoirs' 60 of FIG. 1 that is stored in the memory 40 of the computer system 10 and is adapted for generating a 'wellsite design based on a calibrated Earth Model (EM)', and (2) a 'monitoring wellsite data' step 110.

In FIG. 2, the 'method of designing a wellsite operation' 100 includes: (1) the flowchart of the Software 60 of FIG. 1 including steps 102, 104, 106, and 108, and (2) the 'monitor wellsite data' step 110. In FIG. 2, the flowchart of the Software 60 of FIG. 1 includes four steps 102, 104, 106, and 108, as follows: (1) a 'designing a workflow for an earth model (EM)' step 102 where the workflow would define an Earth Model which is adapted for modeling drilling and completions operations in hydrocarbon reservoirs, (2) a 'building an Initial Earth Model (EM)' step 104, where the EM is adapted to model drilling and completions operations in hydrocarbon workflows, and, during the modeling, the EM will 'optimize drilling and completions operations in hydrocarbon reservoirs' by 'characterizing the properties of the reservoir with enough clarity in order to design drilling and completions operations that minimizes the damage to the hydrocarbon reservoir, minimize the damage to the completion pathway, maximize the production rate, and maximize the ultimate recovery of underground deposits of hydrocarbon in the reservoir', (3) a 'calibrating the Initial Earth Model (EM)' step 106, thereby generating a 'calibrated Earth Model', which is adapted for calibrating the Initial Earth Model of step 104, and (4) a 'generating a wellsite design which is based on the calibrated Earth Model' step 108, the 'generated wellsite design' being adapted for performing drilling and completions operations in hydrocarbon reservoirs based on the 'calibrated/revised Earth Model (EM)' of step 106. In step 110, the 'generated wellsite design' would further produce or generate 'wellsite data' (such as a formation response) which may then be monitored. If desired, following the 'Monitor Wellsite Data' step 110, the 'calibrated Earth Model (EM)' may then be 're-calibrated' and the wellsite operations may then be 're-designed'. The process may be repeated as desired.

In FIG. 2, step 102 involves designing a workflow for an Earth Model (adapted for modeling drilling and completions operations in hydrocarbon reservoirs) using critical wellsite parameters. This is typically done by determining what formation parameters affect the operational results. These formation parameters are grouped based on their similarity and form workflow models. These workflow models characterize the critical formation parameters that affect certain aspects of the wellbore operation. These workflow models also define the data to be collected, and the manner of collecting the data. In this way, an Earth Model (EM) is created that provides a structure with the basic information needed to develop simulation results that represent true wellsite or formation behavior. The workflow models and associated data processed through the workflow models may be selected based on relevance to the desired wellsite operation. For example, certain fracture models may be selected based on their impact on completions operations.

Figure 3:
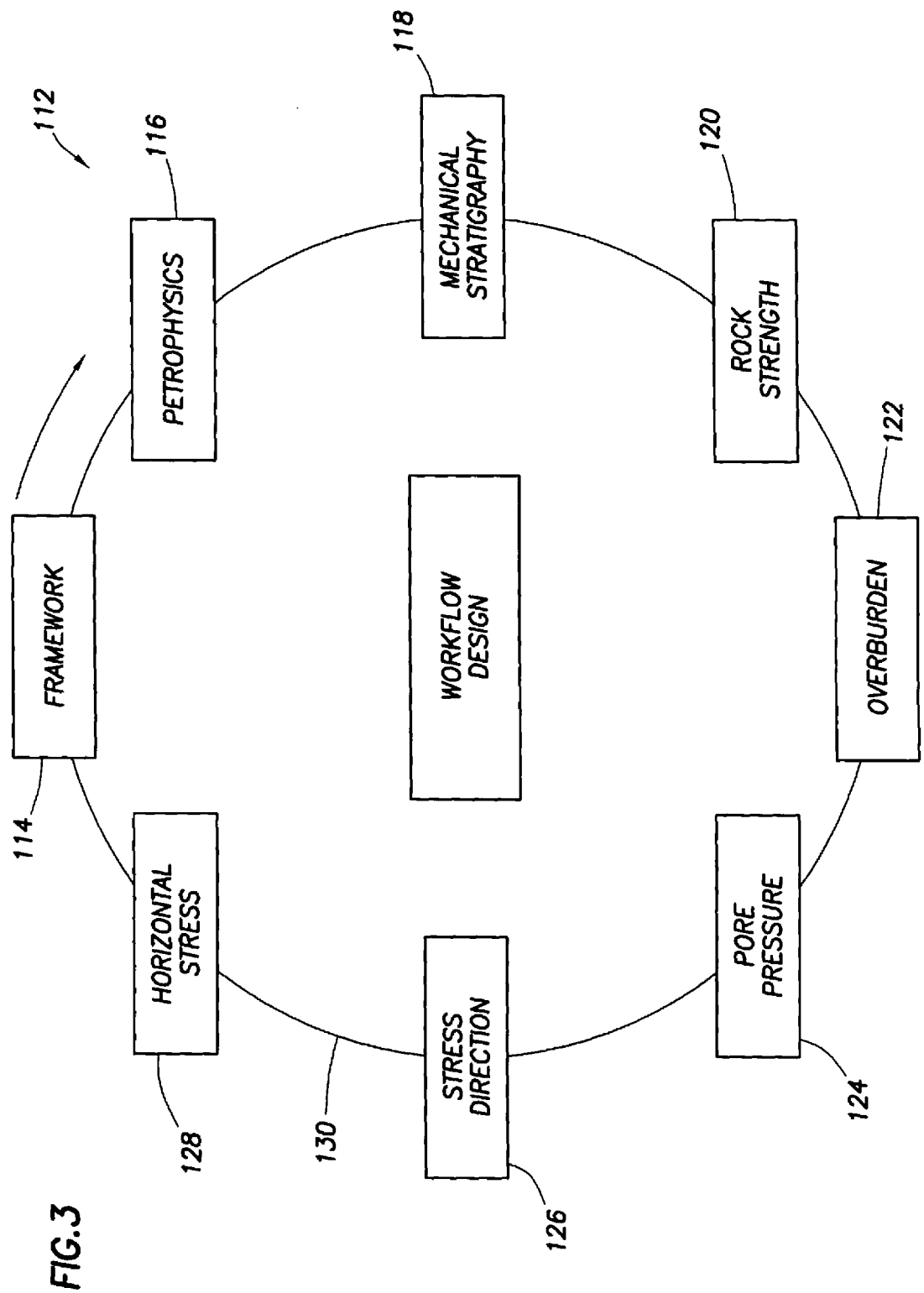
FIG. 3 is a schematic diagram illustrating a 'workflow design' of an 'Initial Earth Model (EM)' based on the workflow design' of FIG. 2, the 'Initial Earth Model (EM)' being adapted to model drilling and completion operations in hydrocarbon reservoirs, and, during the modeling, the EM will 'optimize drilling and completions operations in hydrocarbon reservoirs' by 'characterizing the properties of the reservoir with enough clarity in order to design drilling and completions operations that minimizes the damage to the hydrocarbon reservoir, minimize the damage to the completion pathway, maximize the production rate, and maximize the ultimate recovery of underground deposits of hydrocarbon in the reservoir'.

Referring to FIG. 3, a more detailed construction of the 'Design a workflow for an EM' step 102 of FIG. 2 and the 'Build an Initial EM based on the workflow design' step 104 of FIG. 2 is illustrated. FIG. 3 actually represents an example of a 'method of designing a workflow'. In FIG. 3, a 'workflow design' 112 represents an Initial Earth Model (EM) 112 that is adapted to model drilling and completions operations in hydrocarbon reservoirs, and, during the modeling, the EM will 'optimize drilling and completions operations in hydrocarbon reservoirs' by 'characterizing the properties of the reservoir with enough clarity in order to design drilling and completions operations that minimizes the damage to the hydrocarbon reservoir, minimize the damage to the completion pathway, maximize the production rate, and maximize the ultimate recovery of underground deposits of hydrocarbon in the reservoir'. In FIG. 3, the 'workflow design' 112 (that is adapted for modeling drilling and completions operations in hydrocarbon reservoirs) defines the process for modeling various wellsite conditions (such as, by way of example, drilling and completions operations in hydrocarbon reservoirs) and provides the basic structure for the 'Earth Model (EM) adapted for modeling drilling and completions operations in hydrocarbon reservoirs'. FIG. 3 schematically depicts an example of a 'workflow design' including a plurality of 'individual workflow models' 114, 116, 118, 120, 122, 124, 126, and 128 that are used to define an 'Initial Earth Model (EM)' 112 that is adapted for modeling drilling and completions operations in hydrocarbon reservoirs' relating to 'wellsite completions operations'. Recall that the 'Initial Earth Model 112, which models drilling and completion operations in hydrocarbon reservoirs, is adapted to 'optimize drilling and completions operations in hydrocarbon reservoirs' by 'characterizing the properties of the reservoir with enough clarity in order to design drilling and completions operations that minimizes the damage to the hydrocarbon reservoir, minimize the damage to the completion pathway, maximize the production rate, and maximize the ultimate recovery of underground deposits of hydrocarbon in the reservoir'.

In FIG. 3, depending on the specific application, the 'individual workflow models' of the 'workflow design' 112 may be selected so that certain factors impacting the wellsite operation may be taken into consideration. In the example shown in FIG. 3, the 'individual workflow models' include various models that may impact the wellbore completions operation. In FIG. 3, the 'workflow design' 112 includes a plurality of 'individual workflow models' 114, 116, 118, 120, 122, 124, 126, and 128 that are selected and adapted for 'modeling drilling and completions operations in hydrocarbon reservoirs' for the ultimate purpose of 'designing a completions operation'. The 'individual workflow models' 114, 116, 118, 120, 122, 124, 126, and 128 of the 'workflow design' 112 of FIG. 3 include: a Framework model 114, a Petrophysics model 116, a Mechanical Stratigraphy model 118, a Rock Strength model 120, an Overburden model 122, a Pore Pressure model 124, a Stress Direction model 126, and a Stress Magnitude or Horizontal Stress model 128, respectively (hereinafter called 'individual workflow models' 114, 116, 118, 120, 122, 124, 126, and 128 or just 'individual workflow models').

In the example shown in FIG. 3, an 'Initial' Earth Model (EM) adapted for modeling drilling and completions operations in hydrocarbon reservoirs' is created that includes several 'individual workflow models' 114, 116, 118, 120, 122, 124, 126, and 128. One such workflow model is a 'mechanical stratigraphy' model 118 that has wellsite data characterizing natural fractures. The data may be based on current measurements, pre-determined information and/or other sources. Additional measurements may be taken to collect the desired data for the workflow models.

The data may be compiled, organized and analyzed for processing through the 'individual workflow models' 114, 116, 118, 120, 122, 124, 126, and 128 of FIG. 3. Typically, an 'individual workflow model' is selected according to the desired formation parameters required by the job design. For example, data relating to fracture dimensions may be input into a 'mechanical stratigraphy' model 118 and applied to the EM of FIG. 3 to determine the potential impact on the completions operations.

The types of data that may be used spans a broad area and may include, for example seismic data, drilling data, logging data, geologic and other data. The data may be managed to improve the performance of the job design and/or to facilitate processing. Preferably, the data is quickly and easily accessible. In some cases, the data may be generated from multi-well and/or multi-run data sets. Some such sets may have images that require data process and editing to present the data in a usable form.

Preferably, original data and processing is kept online or near-line for verification and/or additional interpretation that may be required. In addition, data from a geomechanical audit may be synthesized to a key data set for quicker database access and downstream processing. Because these projects often involve large data sets, time and performance can become an issue. In some cases, it may be necessary to move key edited data to a second project for upstream interpretations. Data is preferably configured for quick and easy movement between projects, for example by using a data manager project data export function. The data may be supported in multiple locations. The data may also be configured into smaller data sets to allow for quicker movement across low bandwidth networks. Certain data sets may be identified as key data and positioned for optimum use.

The data may be manipulated as necessary to generate the best outcome. If desired, the data may be analyzed and reconfigured for optimum processing. Based on known constraints or other factors, the data may be prioritized, filtered, arranged or otherwise manipulated to achieve the desired job design. The data is preferably selected according to the problem to be solved. The data may also be audited and analyzed to provide the best data and generate the best outcome.

There is potentially a large amount of data to digest. It may be useful to process certain data, such as seismic data, in advance. A significant amount of data can be analyzed in data processing software. Petrophysical logs may be analyzed for a complete formation evaluation. While borehole images may be analyzed for formation dip sand naturally occurring fractures, another pass through the data may be performed to specifically look for drilling induced conditions, such as fracturing and breakouts. Other data analysis, such as the analysis of caliper data and sonic waveforms, may be performed, for example, where the field processing is suspect. As the number of geomechanical observations increase, constraints may be placed on the workflow models.

Each 'individual workflow model' (i.e., one of workflow models 114, 116, 118, 120, 122, 124, 126, and 128 of FIG. 3) may be a single or multi-dimensional model. A one-dimensional model provides a simple and quick structure for the EM of FIG. 3. Multi-dimensional cases provide more comprehensive information, but are more complex. In some cases, a simple one-dimensional model is sufficient. In other cases, multi-dimensional models may be needed to fully appreciate the wellsite conditions.

The various selected 'individual workflow models' 114, 116, 118, 120, 122, 124, 126, and 128 are capable of predicting conditions that may affect the wellbore operation. In the example shown, the workflow models are selected to provide information about wellbore conditions that may affect the drilling and/or completions operation. Each of the example 'individual workflow models' 114, 116, 118, 120, 122, 124, 126, and 128 of FIG. 3 is described further below.

Framework data is fed into a framework model 114 to predict the structure of the reservoir, such as faults, pinchouts, disconformities, the surfaces of the major formation tops and other parameters. For a one-dimensional model, the framework model may simply be a description of the stratigraphic column, or formation tops, in true vertical depth. A simple one-dimensional model may be insufficient to provide the geomechanics engineer enough insight or understanding to build a fully three-dimensional model. A fully three-dimensional model may be important for three-dimensional stress modeling.

The framework model 114 may be constructed from seismic and logging data. The seismic data may include appropriate seismic sections and velocities calibrated from checkshot data. Typical petrophysical logs may be used to help identify the major formation tops. Dipmeter logs may be used to quantify the formation dip and the location of faults and unconformities.

Petrophysical data is fed into a petrophysical model 116 to predict parameters, such as the porosity, lithology/mineralogy, saturation, reservoir pressure and the permeability of the non-fractured reservoir. The petrophysical model 116 may be constructed from formation logs and recovered core. The porosity mineralogy/lithology, saturation, and permeability of the different layers may be quantified. The petrophysical properties may also be validated with standard petrophysical tests conducted on recovered core.

Mechanical stratigraphy data is fed into a mechanical stratigraphy model 118 to predict the properties of the formation between the formation tops. Elastic properties of the intact rock and characterize the open natural fractures (ONF) system are preferably quantified. This model 118 may be used to differentiate between layers of different mechanical properties. In addition to layers of different lithology, there may be boundaries due to contrasting stiffness, like Young's modulus, and boundaries due to contrasting mechanical support. In some facies, the matrix may support the overburden. In others, the particles of clay support the overburden model 122.

Natural fractures typically alter the global formation stiffness as well as the effective permeability of the formation. Three dimensional anisotropy computations may be used when dealing with transversely isotropic or orthorhombic symmetry. Inversion algorithms may be used to determine the stress-tensor when dealing with anisotropic media. See, e.g., U.S. Pat. No. 5,398,215; "Advancements in Acoustic Techniques for Evaluation Open Natural Fractures" (paper QQ) and "Formation Anisotropy Parameters Using Borehole Sonic Data" (paper TT) presented at the *SPWLA 47$^{th}$ Annual Logging Symposium*, Jun. 4-7, 2006. This may be useful when considering fractured shale formations where the shale layering contributes to the anisotropy due to the intrinsic nature of the rock. Such information may be important when determining the proper shear modulus to use in the EM.

The mechanical stratigraphy model 118 may be constructed from the petrophysical model 116 incorporating the acoustical and wellbore imaging logs. An analysis of wellbore images and sonic scanner data can be used to assist in the processing.

Rock strength data is fed into a rock strength model 120 to predict the coefficients that characterize the yield and failure of the formation. While the specific coefficients are model dependent, a minimum characterization includes the Mohr-Coulomb model described by a friction angle and the unconfined compressive strength and the tensile strength of the formation. Other formation yield and failure models may also be used.

The rock strength model 120 may be constructed from the petrophysical 116 and mechanical stratigraphy model 118. When mechanical tests on recovered core are available, the rock strength model 120 may be calibrated to the laboratory measurements. When mechanical tests are not available, a correlation may be used. Correlations are usually not universal and an uncertainty analysis may be necessary when correlations are used.

Overburden data is fed into an overburden model 122 to documents the vertical stress in the earth. The vertical stress is the integration of the bulk density of the many layers along a vertical line from the point of interest to the surface of the earth. For deviated or horizontal wells it may be necessary to use a two or three-dimensional workflow model. The overburden model 122 may be constructed by integrating a bulk density log. Missing data in the shallow horizons are typically encountered. To eliminate uncertainties from the missing data, the bulk density in the layers with missing data may be estimated. Mud logs may be used to help estimate the missing data.

Pore pressure data is fed into a pore pressure model 124 to document the fluid pressure in the formation. All formations that have porosity typically have a fluid pressure within the pores of various types of formation, such as sands, carbonates and shales. The pore pressure model 124 may be constructed using the framework 114, petrophysical 116, mechanical stratigraphy 118 and overburden 122 models. The seismic processing needed for pore pressure prediction is typically different from that needed for the workflow model. It may also be useful to note the processing applied (post-stack time, pre-stack time, post-stack depth, pre-stack depth) and method used to obtain the velocities, as well as who acquired and who processed the data.

Stress direction data is fed into a stress directional model 126 to document the direction of the three mutually independent principal stresses. Formations with significant structure require complex stress modeling, such as that achieved with finite element or finite difference analysis. Here the boundary conditions of the reservoir may play a critical role in the estimation of the direction of the in-situ stresses acting in the earth.

Stress data from a calibration database is fed into a horizontal stress model 128 to documents the magnitude of the two quasi-horizontal stresses. Formations with significant structure may require more complex stress modeling. The minimum and maximum horizontal stress model 128 is constructed using all the previous models 114, 116, 118, 120, 122, 124, and 126. Lost circulation events, leak-off tests and pre-stimulation calibration tests may provide calibrations points.

In FIG. 3, the workflow models 114, 116, 118, 120, 122, 124, 126, and 128 of FIG. 3 are positioned in a specific, clockwise order about circle 130. Each workflow model is preferably assembled in sequential order according to its clockwise position about circle 130. In the example shown, the models were selected to optimize the workflow design, the EM and the related completion design.

While specific workflow models 114, 116, 118, 120, 122, 124, 126, and 128 of FIG. 3 are depicted in a specific order, it will be appreciated that other workflow models may also be positioned in any desired order depending on: (1) the desired workflow design, (2) the Earth Model (EM), and (3) the designed operation. The workflow design may involve the use of one or more workflow models in sequential order and/or simultaneously. The workflow design may be configured for other wellsite operations and/or other Earth Models (EMs).

In FIG. 3, in the example depicted, the 'workflow design' 112 of FIG. 3, including the 'individual workflow models' 114, 116, 118, 120, 122, 124, 126, and 128, is used to generate an Initial Earth Model (EM) as set forth in step 104 of FIG. 2 (i.e. 'Build an Initial EM based on the Workflow Design', step 104 of FIG. 2). While the techniques described herein relate to Earth Models (EMs), it will be appreciated that various other types of models may be used. For example, 'mechanical earth models' may be used. Techniques for building models are described in, for example, "Watching Rocks Change—Mechanical Earth Modeling," *Oilfield Review*, Summer 2003, p. 22-39, the disclosure of which is incorporated by reference into the specification of this application. The "Watching Rocks Change—Mechanical Earth Modeling" article referenced above describes how an Earth Model (EM) provides a model based on petrophysical and geomechanical data given a unified understanding of such data.

In FIG. 3, the models configured according to the workflow design of FIG. 3 form components of the Earth Model (EM). The techniques described herein provide the ability to define a workflow design based on a large number of wellbore parameters. Most available programs are limited in the number of workflow models and, therefore, their ability to consider more wellbore conditions in their wellbore model. Additional workflow models typically provide additional levels of detail that further define the EM and, therefore, provide a better wellbore model. Unlike existing EM techniques, the job design is configured to accommodate additional parameters, such as fracture aperture, fracture density, fracture connectivity and how the fractures change with pressure, orientation, etc., that can affect the completion operation.

In FIG. 3, in the present application, the 'workflow design' 112 representing an Initial Earth Model (EM) 112, which is adapted for modeling drilling and completions operations in hydrocarbon reservoirs, may have one or more dimensions, depending on the desired complexity. The Earth Model (EM) 112 of FIG. 3 is preferably adapted to model and predict geomechanical processes, such as wellbore instability, the growth of hydraulic fractures or the collapse of formations due to the production of fluids. The processes are determined from intrinsic properties of the formation and the extrinsic forces acting on the formation determined from the workflow models defined in the job design. The Earth Model (EM) 112 of FIG. 3 is also preferably configured to provide all the necessary inputs to run a simulator. The EM 112 may be used to validate the predictions of one or more simulators with the observations of a process such as the stability of a wellbore and the geometry of an induced hydraulic fracture.

In FIG. 3, in view of the above discussion with reference to FIG. 3, the 'Initial Earth Model (EM)' of step 104 of FIG. 3, which is adapted for modeling drilling and completions in hydrocarbon reservoirs, is now fully defined.

In FIG. 2, step 106, when the 'Initial Earth Model (EM)' of FIG. 3 is defined, the 'Initial EM' of FIG. 3 must now be 'calibrated' (see step 106 of FIG. 2). Calibration involves validating and adjusting the EM so that the output from the EM matches corresponding wellsite observations, such as measured properties. In order to 'calibrate' the EM 112 of FIG. 3, wellsite 'observations' are compared with 'predictions' generated by an EM simulator. If the wellsite 'observations' match the 'predictions' from the EM simulator, the EM is said to be 'calibrated.' If not, adjustments may be made to the EM simulator until a match is made between the wellsite 'observations' and the 'predictions' from the EM simulator. At that point, the EM can said to be 'calibrated'.

Figure 4:
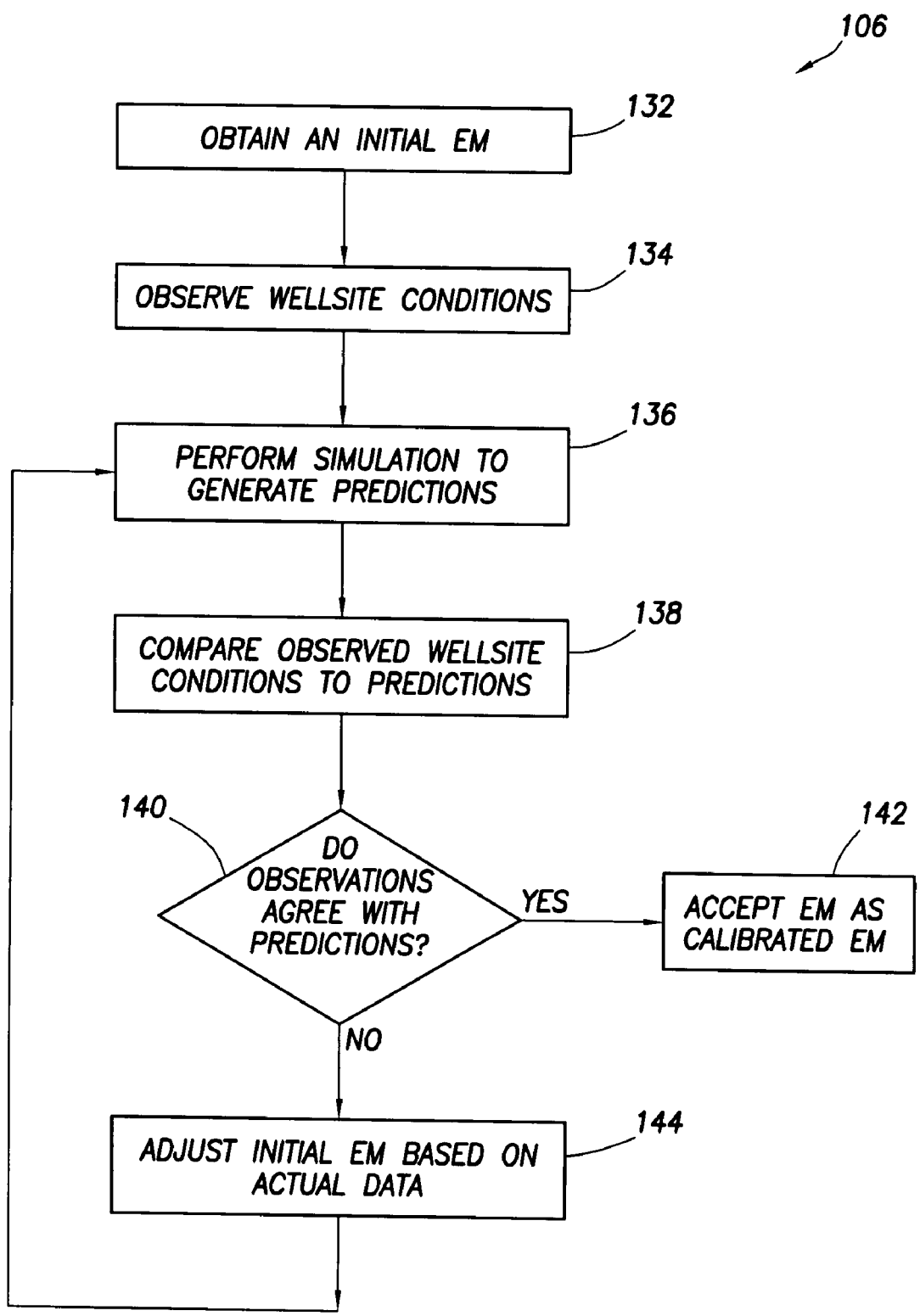
FIG. 4 is a flow chart depicting a method of calibrating the 'Initial Earth Model (EM)' representing drilling and completions operations' of FIG. 3.

Referring to FIG. 4, a more detailed construction of the calibration step 106 of FIG. 2 is illustrated. In FIG. 4, a flow chart depicting the calibration step 106 of FIG. 2 is illustrated.

In FIG. 4, step 132, when the 'Initial EM' 112 of FIG. 3 is built pursuant to step 104 of FIG. 2, the 'Initial EM' 112 has now been 'obtained' (step 132 in FIG. 4). When the 'Initial EM' 112 has been 'obtained' pursuant to step 132 of FIG. 4, the 'Initial EM' 112 must now be 'calibrated'. Alternatively, an 'Initial EM' (such as the 'Initial EM' 112 of FIG. 3) may be pre-defined for the specific application. The 'Initial EM' 112 is then calibrated to wellsite conditions.

The 'calibration' step involves 'validation' and 'adjustment' (if necessary). Calibration also involves the engineering problem of adjusting a good measurement, or a measurement that is sensitive to the property being studied, to accurately reflect the property of interest. 'Validation' has to do with the scientific problem of determining if a measurement is sufficiently sensitive to the property being studied to warrant calibration.

The 'validation' step is used to provide verification that the Earth Model (EM) 112 is capable of predicting the desired wellsite property. Validation models may be used to insure the 'accuracy' of the EM 112. Validation is achieved when wellsite predictions sufficiently match wellsite observations.

In FIG. 4, step 134, wellsite conditions may be selected and/or observed, step 134 of FIG. 4. The wellsite conditions may include measurements or other observations taken at the wellsite. Preferably, the selected wellsite conditions involve data that is pertinent to the job design. Examples of some such data may be the same data used as inputs for the models in FIG. 3. Observed measurements, such as in-situ measurements, of geomechanical processes may be used. For instance, an analysis of the downhole annular pressure and resistivity measurements acquired during a lost circulation event may be used as a calibration point for the horizontal stress model. Drilling data my also provide a significant amount of calibration and validation information. The daily drilling reports may be read and the significant drilling events highlighted. Major events may be further analyzed in detail.

In FIG. 3 and FIG. 4, step 136, a set of wellsite 'predictions' are generated using 'simulations', such as geomechanical simulations (step 136 of FIG. 4). The 'simulations' may be performed using the 'simulators' or 'workflow models' 114, 116, 118, 120, 122, 124, 126, and 128 shown in FIG. 3. A variety of data and/or associated models, such as the horizontal stress model 128 or others described above, may be used in the simulations. Other models, such as a wellbore stability validation model may be validated when the predicted wellbore instabilities are confirmed with observations.

In FIG. 4, step 138, the 'observed conditions' are compared with the 'predictions' that are generated by the simulator in step 136 (step 138 of FIG. 4). If the comparison is within a certain range, the measurements are said to agree. If the measurements do not agree, the measurements are said to disagree or provide a mis-match. In this way, geomechanical processes may be validated with the wellsite observations. For instance, acoustic emission mapping provides a three-dimensional movie showing the initiation and growth of a hydraulic fracture stimulation. This data can easily show if the minimum horizontal stress magnitude in the sand reservoir is less then the minimum horizontal stress magnitude in the boundary shales.

In a wellsite completions example, two components of the EM 112 are typically considered during validation, namely the evaluation of the mechanical stratigraphy 118 and the evaluation of the principal in-situ stress direction 126 and horizontal stress magnitudes 128. An evaluation of mechanical stratigraphy 118 may involve the diagnosis of several wellbore parameters, such as open natural fractures, stress induced anisotropy, natural versus man-made fractures, magnitude of far field stresses, and maximum horizontal stresses. Evaluation of these parameters is described further below.

The mechanical stratigraphy 118 may be difficult to quantify due to the difficulty in diagnosing and characterizing open natural fractures. Open natural fractures may be diagnosed and characterized using with wellbore images. However, in a certain percentage of cases, it may be difficult or impossible to distinguish drilling induced fractures from open natural fractures when the natural fracture bisects the borehole at high apparent dip. The fracture aperture typically presented is based upon an electrical model that contrasts the fracture resistivity, back ground conductivity and the resistivity of the mud. Although the word "aperture" is typically used in the oil and gas industry to refer to the opening of a fracture, as used herein "aperture" used to refer to the face of the fracture, whether open or closed, and if open, its width (and/or size). Poor borehole conditions, in-accurate mud resistivity information, conductive material fracture lining and less than precise technique can degrade the calculation. Determining fracture permeability from wellbore images may be based upon fluid mechanics traditional slot flow equations using aperture. The sonic scanners when run in combination with the imaging devices may be used to resolve these issues.

Observations using imaging and/or sonic scanning technology may be used to identify open natural fractures. For example, observations, such as attenuation computed from the Stoneley mode, the difference between minimum crossline energy and the maximum crossline energy, anisotropy along various regions, minimum crossline energy and associated anisotropy, attenuation, and energy, may be used to indicate open natural fractures.

Imaging and scanning may also be used to analyze other characteristics. Acoustical anisotropy due to stress may also be analyzed by evaluating Stoneley attenuation response and the dispersion curves. Patterns generated by these items may be used to indicate conditions, such as a stress as the source of anisotropy rather than open natural fractures, strong energy on both the fast shear flexural wave and the slow shear flexural wave, and the presence or absence of fractures.

The relationship between the direction of the fast shear wave and the source of the acoustical anisotropy may be used to further analyze the observations. The direction of anisotropy in naturally fractured intervals may be viewed in various directions. Each natural fracture has a certain fracture direction or strike. Natural fractures can often be found in conjugate shear sets. The direction of the fast shear wave typically corresponds to the strike of the fracture. The images may be used to determine the direction of the maximum horizontal stress direction in intervals of stress-induced anisotropy. These observations may be confirmed using dispersion analysis.

Predictions for diagnosing drilling induced fracturing may be generated using the Initial EM 112 in conjunction with a wellbore stability simulator to model the drilling induced fractures from measuring the annular pressure extremes during drilling. The predictions may indicate constraints for performing a wellsite operation. For example, the predictions generated by the simulator may indicate that the formation is prone to fail in, for example, a wide breakout or vertical tensile fracture. Examples of breakouts are described in "Logging-While Drilling Images for Geomechanical, Geological and Petrophysical Interpretations", Paper JJJ, *SPWLA 40$^{th}$ Annual Logging Symposium,* Oslo, Norway, 1999, the disclosure of which is incorporated by reference into the specification of this application.

Magnitude of the far field stresses may be generated, for example, as described in U.S. Pat. No. 6,904,365, the disclosure of which is incorporated by reference into the specification of this application. A continuous stress model may be formed by determining the variation of stress with lithology. For instance, a comparison of the horizontal stress to in the shales than the sands may be performed. In one example, a drilling induced fracture terminating at a shale boundary may be evidence that the minimum horizontal stress in the bounding shales is greater than in the reservoir.

Techniques for determining maximum horizontal stresses are described, for example, in "Interpretation of Fracturing Pressures", *SPE* 8297, September 1981, the disclosure of which is incorporated by reference into the specification of this application. This paper describes techniques for computing the natural fracture dilation pressure. Hydraulic fracture monitoring may be used to determine if the stimulation is dilating the natural fractures. If so, the downhole pressure may be measured and the value for the maximum horizontal stress determined. Other wellbore parameters, such as fracture aperture, fracture permeability, fracture spacing, fracture connectivity to the borehole, fracture intersections away form the borehole, fracture/stress contributions, etc., may also be considered.

In FIG. 4, step 140, to complete the validation process, the observations may be compared with the predictions generated by the simulator(s) to determine if there is a match, step 140 of FIG. 4. The observations may be said to match or agree with the predictions if they meet pre-defined criteria. The criteria may be set at a certain range and adjusted as necessary.

In FIG. 4, step 144, once the validation process is complete, it may be necessary to adjust the EM, step 144 of FIG. 4. If the 'observations' fail to sufficiently agree with the 'predictions' (see 'No' output from triangle 140 in FIG. 4), the EM may be rejected. An inconsistency between the measurements and observations may be an indicator that the EM fails to provide an accurate model. The EM may then be adjusted and re-evaluated via step 144. The simulations may then be re-performed using the adjusted EM via step 136 and the process repeated.

The calibration step may also optionally involve other refinements, such as filtering. Additional analysis may be performed during calibration of the EM. A quick study of the geomechanical process of interest may be conducted to validate the EM and/or determine the sensitivity of the geomechanical process to uncertainties in the EM.

In FIG. 4, step 142, the process may be repeated as desired typically until a calibrated EM is achieved, step 142 of FIG. 4. If the 'observations' are in sufficient agreement with the 'predictions', the EM 112 of FIG. 3 may be accepted as validated and calibrated, step 142 of FIG. 4. If so, the process is complete, and the calibrated EM 112 may be used to generate a wellsite design, step 108 of FIG. 2.

Figure 5:
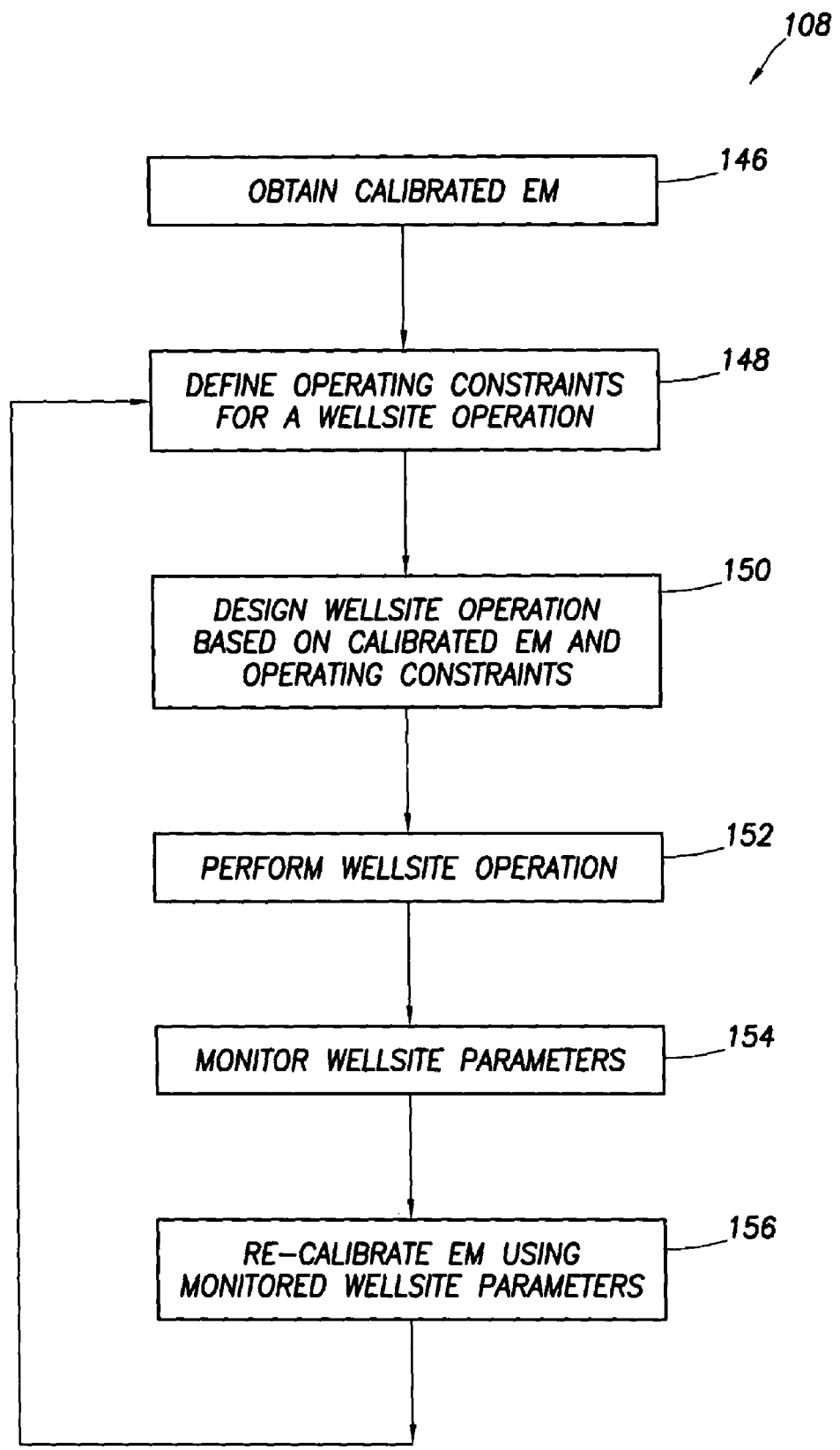
FIG. 5 is a flow chart depicting a 'method of generating a wellsite drilling and completions operational design' which uses the Initial Earth Model of FIG. 3 which has been calibrated using the calibration method of FIG. 4.

Referring to FIG. 5, a more detailed construction of step 108 of FIG. 2 is illustrated. Recall that FIG. 2, step 108, involves using the 'calibrated EM' to generate a wellsite design. In one example of step 108 of FIG. 2, the 'calibrated EM' is used to 'design an optimized drilling and completion design'. The completion design may involve any downhole wellbore activity, such as cementing, stimulation, etc. FIG. 5 is a flow chart describing step 108 of FIG. 2 in greater detail.

In FIG. 5, step 146, the step 108 of FIG. 2 starts by 'obtaining' a 'calibrated EM', step 146 of FIG. 5. The 'calibrated EM' may be 'obtained' by receiving the 'calibrated EM' in response to the completion of the execution of step 142 of FIG. 4.

In FIG. 5, step 148, the 'calibrated EM' is used to define 'operating constraints' for a wellsite operation, step 148 of FIG. 5. The 'operating constraints' are defined depending on the desired wellsite operation.

In FIG. 5, step 150, a wellsite operation may then be designed based on: (1) the calibrated EM, and (2) the operating constraints, step 150 of FIG. 5.

In FIG. 5, step 152, once the design of the wellsite operation is complete, the wellsite operation may then be implemented according to the wellsite design, step 152 of FIG. 5.

In FIG. 5, step 154, wellsite conditions may be monitored during wellsite operations, step 154 of FIG. 5. By monitoring, the performance of the EM and the designed wellsite operation may be verified. Additionally, performance is preferably optimized in real-time to address changes in operating conditions. Examples of monitored items in a completions operation may include bottom hole treatment pressure and microseismic mapping.

In some cases, the optimization of a wellsite operation may affect the optimization of other operations. Overlapping data, and constraints may be defined for the various operations. In one example, a reservoir completions model may be defined based on consideration of parameters, such as permeability, fracture azimuth, anisotropy magnitude and/or azimuth. Another such completions model relates to optimized frac geometry based on frac geometry, frac costs and frac net present value. These items may be considered as constraints and/or data that is input into models, compared with predictions and/or monitored during the design process.

In FIG. 5, step 156, in some cases, conditions may change and further adjustment to the EM may be required. If so, the EM may again be calibrated using the calibration process of FIG. 4 to define a re-calibrated EM, step 156 of FIG. 5. The EM may be recalibrated as desired and/or based on pre-determined critieria.

Examples of wellsite operations to be designed may include optimized cementing design, fracture modeling and natural fracture mitigation, as well as fluid optimization and. For optimized cementing design, the EM may be optimized for maximum cementing pressure and natural fracture bridging. Similarly, fracture modeling may involve optimization of treatment pressure calculations and rectification with EM natural fracture dilation pressure. Natural fracture mitigation may involve optimization of a bridging package having defined material sizing and volumes, pressure drop to prevent natural fracture dilation and bridging material permeability. In each case, models and observations may be tailored to provide the best information and simulation for defining the EM for the specific wellsite design.

In a cement design operation, the EM gives a continuous stress profile vs. depth. If during the cementing operations the annular pressure exceeds the fracture gradient, then whole cement will typically be pumped into an induced hydraulic fracture. If the fracture gradient is lower in the sands than in the shales, then cement will be pumped or gravity pulled into reservoir rock. This may then lower or eliminate the permeability of the completion pathway.

The design of the cementing job is typically restricted such that it does not exceed the minimum in-situ stress. It may, therefore, be of use to consider measurement and evaluation of cement fall back as this directly responds to the occurrence of cement invasion into the reservoir by one of the three mechanisms described above.

Another parameter that may be of use in cement design involves log derived data that describes the density and aperture of natural fractures adjacent to formations reservoir pressure. This data may be applied to optimize the cement placement in the annulus between the steel casing and the formation. In addition, the critical pressures that cause these natural fractures to dilate and start taking completion fluids can be taken into account within the design of the isolation treatment, either by avoiding exceeding this critical pressure or by providing loss circulation materials to bridge and stop excessive losses of cement into the formation. This may aid in effective zonal isolation and/or reduce damage to potential hydrocarbon producing intervals.

Hydraulic fracturing is another completion technique that may be designed. Hydraulic fracturing is commonly applied in low permeability formation to stimulate the productive potential to the point of enabling very low permeability formations to produce hydrocarbons at an economic rate. Log derived data that describes the natural fracture density, aperture, and critical dilation pressures can be critical to optimized stimulation completion design. From this log derived information, optimally sized bridging materials, such as but not limited to particulates or fibers, are preferably sized larger than the aperture than the natural fractures. These fluids or particulates may be used to temporarily impede fracturing fluid loss down these natural fractures to reduce leakoff volumes and subsequent pressures in offsetting natural fractures. This may be used to aid in delaying or preventing further dilation of these natural fractures while injecting fracturing fluids. Such leakoff can cause damage to the natural fracture permeability from incompatible fluids, and result in a premature termination of the stimulation treatment. This log derived information may also be used to modify the stimulation treatment to avoid critical pressures where natural fracture dilation would occur by manipulating the frac fluid volumes, injection rate or injection fluid viscosity. In the past low viscosity fracturing fluids, using very low or no polymers, have been applied to reduce damage to natural fracture systems. However these low viscosity fracturing fluids can often have high leakoff rates into intersecting natural fracture systems. This can cause inefficient fracture stimulation which reduces the volume of formation surface area the induced hydralic fracture will intersect. The application of optimized sized bridging materials based on log derived data, can greatly decrease the leakoff into intersecting natural fracture systems and make low viscosity fracturing fluids more efficient and enable more rock surface area to be exposed to the induced hydralic fracture system.

Log derived information can be instrumental in determining the nature of the fracture stimulation that will occur. This can provide insight to the propensity of elastically coupled planar fractures or shear slippage fracture systems. This information can be valuable in determining what type of fluids to employ and what type of proppant would be required (if any at all).

Figure 6A:
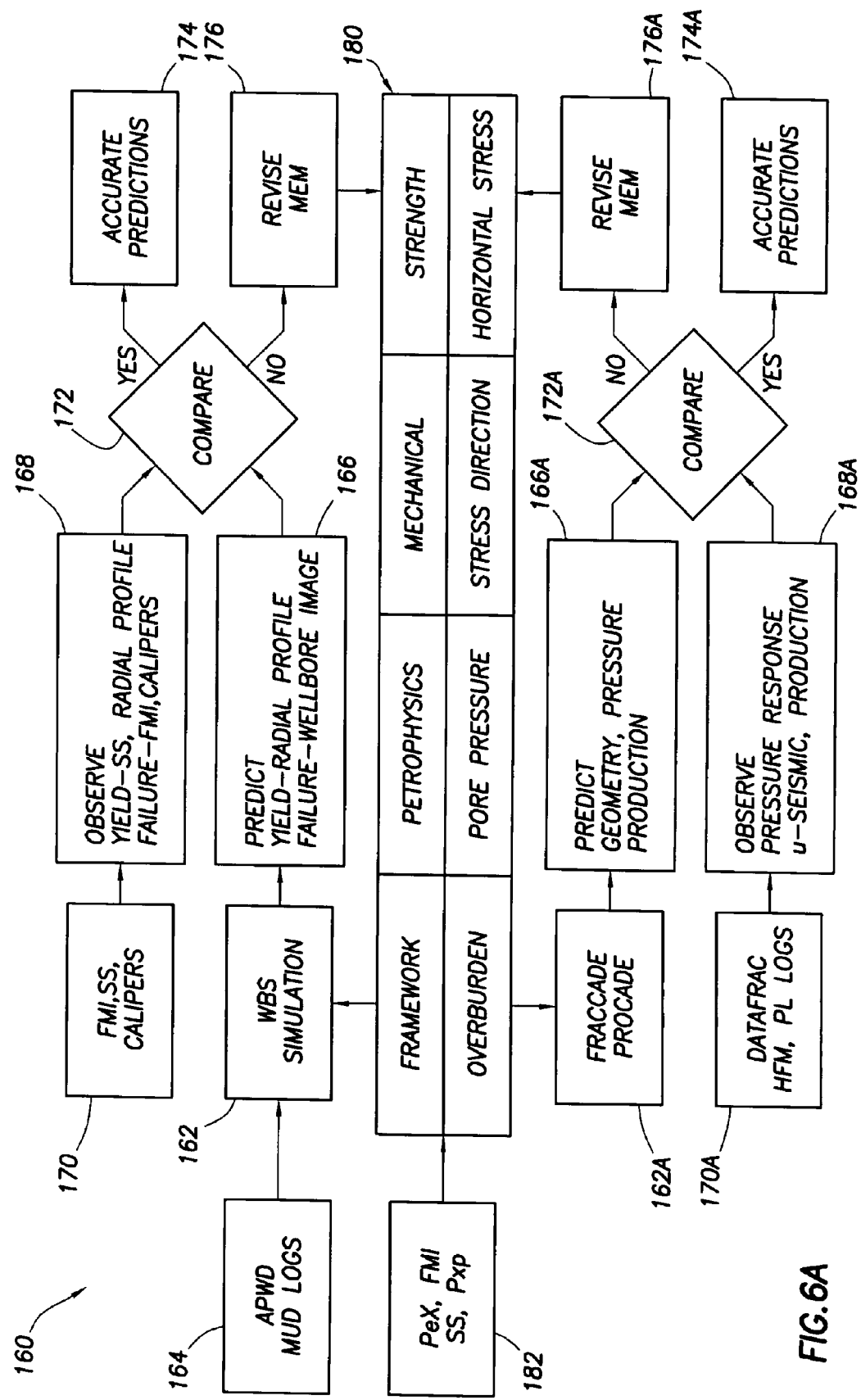
FIG. 6A is a flow chart depicting a more detailed construction of the 'method of generating a wellsite drilling and completions operational design' of FIG. 5.

Referring to FIG. 6A, a specific example of a method 160 of designing a wellsite operation (step 108 of FIG. 2) involving a 'drilling and completions' job is illustrated.

In FIG. 6A, in a first application, an Earth Model (EM) 180 is created based on the 'workflow models' 114, 116, 118, 120, 122, 124, 126, and 128 illustrated in FIG. 3, namely, framework model, petrophysics model, mechanical stratigraphy model, rock strength model, vertical stress model, pore pressure model, stress direction model and stress magnitude model. Data 182, such as imagining, logs, sonic scanners and other pertinent data, may be input into the 'workflow models' of the EM 180 in FIG. 6A in order to generate the Earth Model (EM) 180. Simulations 162 are performed based on the EM 180 to generate predictions 166, such as yield and failure. The simulations 162 may be based on data 164, such as APWD mud logs. The simulations 162 generate predictions 166, such as failure and yield. Observations 168, such as yield and failure, may also made using measurements from instruments 170, such as imagers, sonic scanners and calipers. The observations 168 and predictions 166 may then be compared in the compare triangle 172. Where the comparisons indicate agreement (see 'Yes' from triangle 172), the predictions are considered accurate 174. If not, the EM 180 may be revised 176 [see 'Revise Mechanical Earth Model (MEM)' 176] until the predictions 166 are determined to be accurate 174.

In FIG. 6A, in a second application, simulations 162A are performed based on the EM 180 to generate predictions 166A, such as yield and failure. The simulations involve various models capable of generating the predictions 166A, such as geometry, pressure and production. Observations 168A, such as pressure response, seismic and production, may also made using measurements from instruments 170A, such as logs. The observations 168A and predictions 166A may then be compared in the compare triangle 172A. Where the comparisons indicate agreement (see 'Yes' from compare triangle 172A), the predictions are considered accurate 174A. If not, the EM 180 may be revised 176A [see 'Revise Mechanical Earth Model (MEM)' 176A] until the predictions 166A are determined to be accurate 174A.

A functional description of the operation of the 'Software adapted for optimizing drilling and completion operations in hydrocarbon reservoirs' 60 of FIG. 1, when the Software 60 is executed by the processor 20 of the computer system 10 of FIG. 1, will be set forth in the following paragraphs with reference to FIGS. 1 through 6A of the drawings.

The 'Software adapted for optimizing drilling and completion operations in hydrocarbon reservoirs' 60 of FIG. 1, stored in the memory 40 of the computer system 10 of FIG. 1, will, when executed by the processor 20, model drilling and completions operations in hydrocarbon workflows and, during the modeling, the Software 60 will 'optimize drilling and completion operations in hydrocarbon reservoirs'. However, the Software 60 will 'optimize drilling and completions operations in hydrocarbon reservoirs' by: identifying a 'workflow' that characterizes the properties of the reservoir with enough clarity in order to design drilling and completion operations that minimizes the damage to the hydrocarbon reservoir, minimize the damage to the completion pathway, maximize the production rate, and maximize the ultimate recovery of underground deposits of hydrocarbon in the reservoir. When the Software 60 'optimizes the drilling and completions operations in hydrocarbon reservoirs', the Software 60 will then 'generate a wellsite design based on a calibrated Earth Model (EM)'. For example, the 'wellsite design' generated by Software 60 will pertain or relate to 'drilling and completions operations in hydrocarbon reservoirs'. In FIG. 2, the 'Software adapted for optimizing drilling and completion operations in hydrocarbon reservoirs' 60 comprises steps 102, 104, 106, and 108. Step 102 of FIG. 2 is the first step of Software 60 which is adapted for 'modeling drilling and completions operations in hydrocarbon workflows' by 'optimizing drilling and completion operations in hydrocarbon reservoirs': Design a 'workflow' for an 'Earth Model (EM)' (step 102). However, the 'workflow' of step 102 must have as its objective: to 'model drilling and completions operations in hydrocarbon workflows' and, during the modeling, to 'optimize drilling and completion operations in hydrocarbon reservoirs' by 'characterizing the properties of the reservoir with enough clarity in order to design drilling and completion operations that minimizes the damage to the hydrocarbon reservoir, minimize the damage to the completion pathway, maximize the production rate, and maximize the ultimate recovery of underground deposits of hydrocarbon in the reservoir'. Therefore, in FIG. 3, the 'workflow', referenced in step 102 of FIG. 2, must include the following 'workflow models' (which, when combined together in the manner illustrated in FIG. 3, will 'model drilling and completions operations in hydrocarbon workflows' and 'optimize drilling and completion operations in hydrocarbon reservoirs' by 'characterizing the properties of the reservoir with enough clarity in order to design drilling and completion operations that minimizes the damage to the hydrocarbon reservoir, minimize the damage to the completion pathway, maximize the production rate, and maximize the ultimate recovery of underground deposits of hydrocarbon in the reservoir'): the Framework model 114, the Petrophysics model 116, the Mechanical Stratigraphy model 118, the Rock Strength model 120, the Overburden model 122, the Pore Pressure model 124, the Stress Direction model 126, and the Stress Magnitude or Horizontal Stress model 128 (hereinafter called "workflow models 114, 116, 118, 120, 122, 124, 126, and 128"). Thus, when the 'workflow models 114, 116, 118, 120, 122, 124, 126, and 128' in FIG. 3 are combined together in the manner illustrated in FIG. 3, the 'workflow models 114, 116, 118, 120, 122, 124, 126, and 128 will, when executed by the processor 20 of the computer system 10 of FIG. 1, perform and accomplish the following objective: 'model drilling and completions operations in hydrocarbon workflows' and 'optimize drilling and completion operations in hydrocarbon reservoirs' by 'characterizing the properties of the reservoir with enough clarity in order to design drilling and completion operations that minimizes the damage to the hydrocarbon reservoir, minimize the damage to the completion pathway, maximize the production rate, and maximize the ultimate recovery of underground deposits of hydrocarbon in the reservoir'. When the workflow is designed for an Earth Model (step 102 of FIG. 2) in the manner described above, step 104 of FIG. 2 is the second step of the Software 60 which is adapted for 'model drilling and completions operations in hydrocarbon workflows' and 'optimizing drilling and completion operations in hydrocarbon reservoirs': Build an 'Initial Earth Model (EM)' based on the workflow design. In FIG. 3, the 'Initial Earth Model (EM)' 112 was built based on the workflow design, and, in FIG. 6A, the 'Initial Earth Model (EM)' 180 was built based on the workflow design. In FIG. 3, note that the 'Earth Model' 112 in FIG. 3 (and, in FIG. 6A, the 'Earth Model' 180) includes all of the following 'workflow models' which are collectively designed to model drilling and completions operations in hydrocarbon reservoirs: the Framework model 114, the Petrophysics model 116, the Mechanical Stratigraphy model 118, the Rock Strength model 120, the Overburden model 122, the Pore Pressure model 124, the Stress Direction model 126, and the Stress Magnitude or Horizontal Stress model 128. In FIG. 2, step 106 of FIG. 2 is the third step of the Software 60 which is adapted for 'model drilling and completions operations in hydrocarbon workflows' and 'optimizing drilling and completion operations in hydrocarbon reservoirs': Calibrate the Initial Earth Model (EM). The steps involved in 'calibrating the Initial Earth Model (EM)' 106 are illustrated in both FIG. 4 and FIG. 6A. In FIG. 4, 'each of the workflow models 114, 116, 118, 120, 122, 124, 126, and 128' must be 'calibrated' using the steps shown in FIG. 4. That is, when calibrating 'each of the workflow models 114, 116, 118, 120, 122, 124, 126, and 128', the following steps 132, 134, 136, 138, 140, 142, 144 of FIG. 4 should be executed in connection with 'each of the workflow models 114, 116, 118, 120, 122, 124, 126, and 128': Observe wellsite conditions to generate 'observations' (step 134 of FIG. 4), Perform a simulation to generate 'predictions' from 'each of the workflow models 114, 116, 118, 120, 122, 124, 126, and 128' (step 136 of FIG. 4), and Compare the observed wellsite conditions (i.e., the 'observations') to the 'predictions' (step 138 of FIG. 4). Then, ask the following question: 'Do the 'observations' agree with the 'predictions' (step 140 of FIG. 4). If the 'observations' agree with the 'predictions', accept the 'Initial Earth Model (EM)' 112 of FIG. 3 (and 180 of FIG. 6A) (step 142 of FIG. 4). If the 'observations' do not agree with the 'predictions', adjust the 'Initial Earth Model' 112 of FIG. 3 (and 180 of FIG. 6A) based on actual data, and repeat steps 136, 138, 140 until the 'observations' do agree with the 'predictions' (step 144 of FIG. 4). In FIG. 2, step 108 of FIG. 2 is the fourth step of the Software 60 which is adapted for 'model drilling and completions operations in hydrocarbon workflows' and 'optimizing drilling and completion operations in hydrocarbon reservoirs': Generate Wellsite Design(s) based on the Calibrated Earth Model. Recall from FIG. 4 that, if the 'observations' do agree with the 'predictions', the 'Earth Model (EM)' 112 of FIG. 3 has been accepted. Therefore, since the 'observations' did agree with the 'predictions', the 'Earth Model (EM)' 112 of FIG. 3 has been accepted. Therefore, the 'Earth Model (EM)' 112 is now called a 'Calibrated Earth Model 112'. As a result, at this point, it is necessary to 'generate a wellsite design based on the Calibrated Earth Model 112' of FIG. 3 (step 108 of FIG. 2). In FIG. 5, in order to 'generate a wellsite design based on the Calibrated Earth Model 112', refer to FIG. 5 which illustrates the steps of a method for 'generating a wellsite design based on the Calibrated Earth Model 112'. In FIG. 5, in order to 'generate a wellsite design based on the Calibrated Earth Model 112, perform the following steps in FIG. 5: obtain the Calibrated Earth Model 112 of FIG. 3 (step 146 of FIG. 5), define operating constraints for a wellsite operation (step 148 of FIG. 5), design a wellsite operation based on the calibrated Earth Model 112 and operating constraints (step 150 of FIG. 5), perform the wellsite operation (step 152 of FIG. 5), monitor wellsite parameters (step 154 of FIG. 5), and Re-calibrate the Earth Model 112 using the monitored wellsite parameters (step 156 of FIG. 5). When the steps 146-156 of FIG. 5 have been executed by processor 20 and the steps 146-156 of FIG. 5 have been performed, the Software 60 of FIG. 1 has now achieved its desired objective, that is, to 'model drilling and completions operations in hydrocarbon workflows' and 'optimize drilling and completion operations in hydrocarbon reservoirs' by 'characterizing the properties of the reservoir with enough clarity in order to design drilling and completion operations that minimizes the damage to the hydrocarbon reservoir, minimize the damage to the completion pathway, maximize the production rate, and maximize the ultimate recovery of underground deposits of hydrocarbon in the reservoir'.

DETAILED DESCRIPTION

This specification discloses a number of technologies and an associated workflow that optimizes drilling and completion operations in hydrocarbon reservoirs that may or may not be naturally fractured. For instance, in order for a reservoir to be commercial, the reservoir and the completion pathway must have sufficient permeability. Years ago, it was discovered that many reservoirs did not have sufficient permeability to be commercial unless a hydraulic fracture was created that connected more of the reservoir to the wellbore. Additionally, the hydraulic fracture or other completion pathway, for example the perforation, also needed to have sufficient permeability in order for the reservoir to be commercial. As the search for hydrocarbons continues and the price of hydrocarbon increases, technologies are developing that allow commercial production from reservoirs with micro Darcy permeability and lower. However, commercial development is often limited by insufficient permeability of the completion pathway. For instance, in formations with a low fracture gradient, the cement job often fractures the formation forcing cement into the induced fracture and effectively rendering the reservoir non-commercial. When natural fractures are present, the cement job and/or other completion fluid often damages their permeability and greatly reduces the commercial impact of the completion. This specification discloses a workflow that characterizes the properties of the reservoir with enough clarity to design drilling and completion operations that minimizes the damage to the hydrocarbon reservoir and completion pathway, maximizes production rate and ultimate recovery.

A very simplistic view was taken of natural fracture characterization for completion decisions. Usually it consisted of "are there natural fractures yes or no" Little attention was given to the aperture or density of these fractures to optimize completion decisions, let alone the genesis of these natural fractures or the residual forces that may still exist. In many cases, completion optimization solutions may be derived by empirical means that determine critical pressures beyond which excessive leakoff will be experienced (Nolte 1980), but no analytical process was identified to efficiently identify such propensities prior to completion or stimulation injection.

Figure 6B:
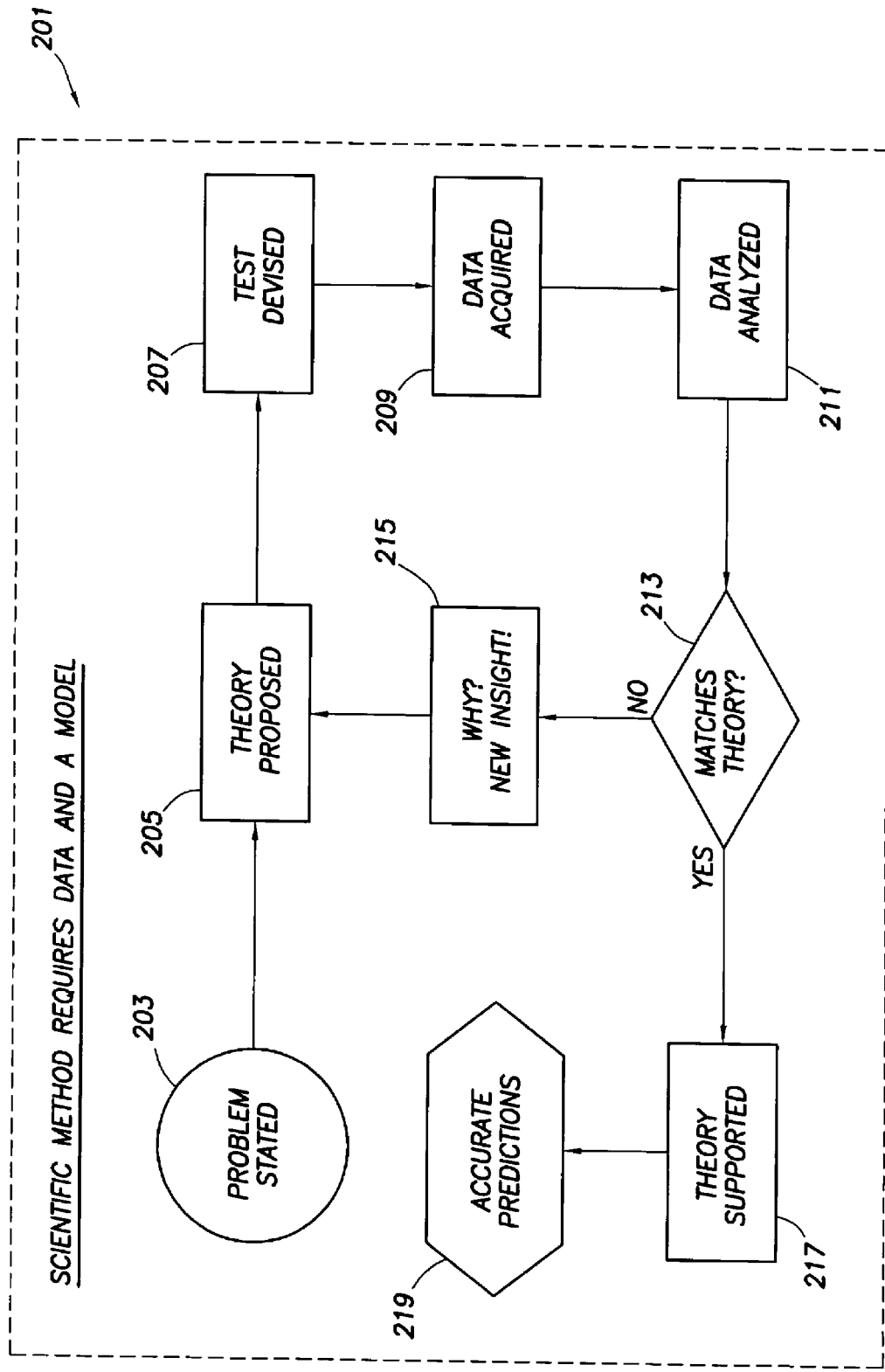
FIG. 6B illustrates a scientific method or process wherein a model or theory is proposed and refined until the model or theory accurately predicts the results of an experiment or process.

Referring to FIG. 6B, in this specification, a scientific method or process 201 is illustrated. The scientific method or process 201 (which requires data and a model) includes a process where a model or theory is proposed and refined until the model accurately predicts the results of an experiment or process. In FIG. 6B, a problem is stated 203, a theory is proposed 205, and a test is devised 207. Then, a set of data is acquired 209 and the data is analyzed 211. Ask the question: does the data match the theory 213. If the answer to that question is 'no', ask 'why', and acquire new insight 215, and repeat steps 205 through 211. If the answer to that question is 'yes', the theory is supported 217. In that case, 'accurate predictions' are the result 219.

Figure 7A:
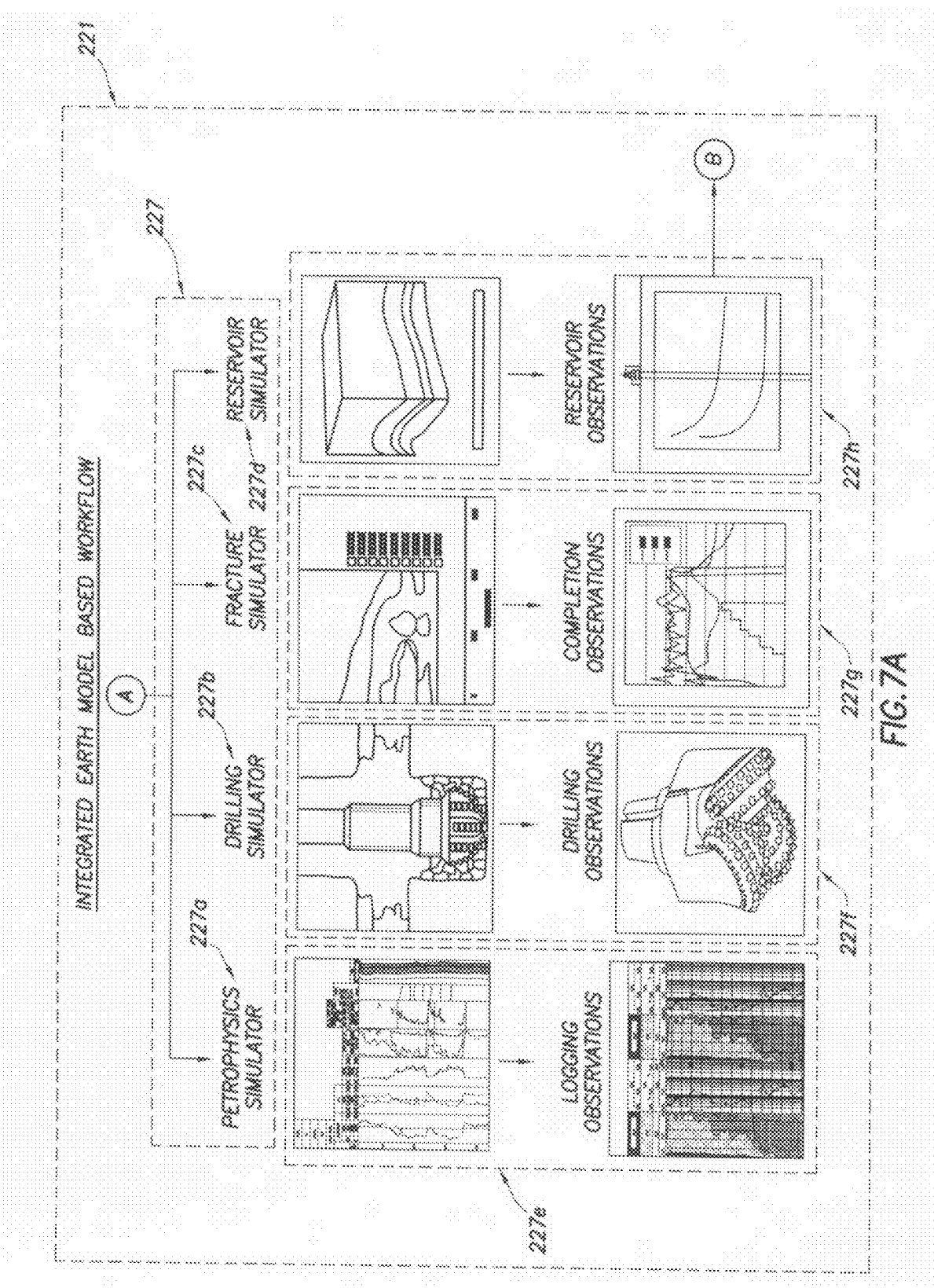
FIGS. 7A and 7B illustrates how the scientific method or process of FIG. 6 is applied to oilfield operations.
Figure 7B:
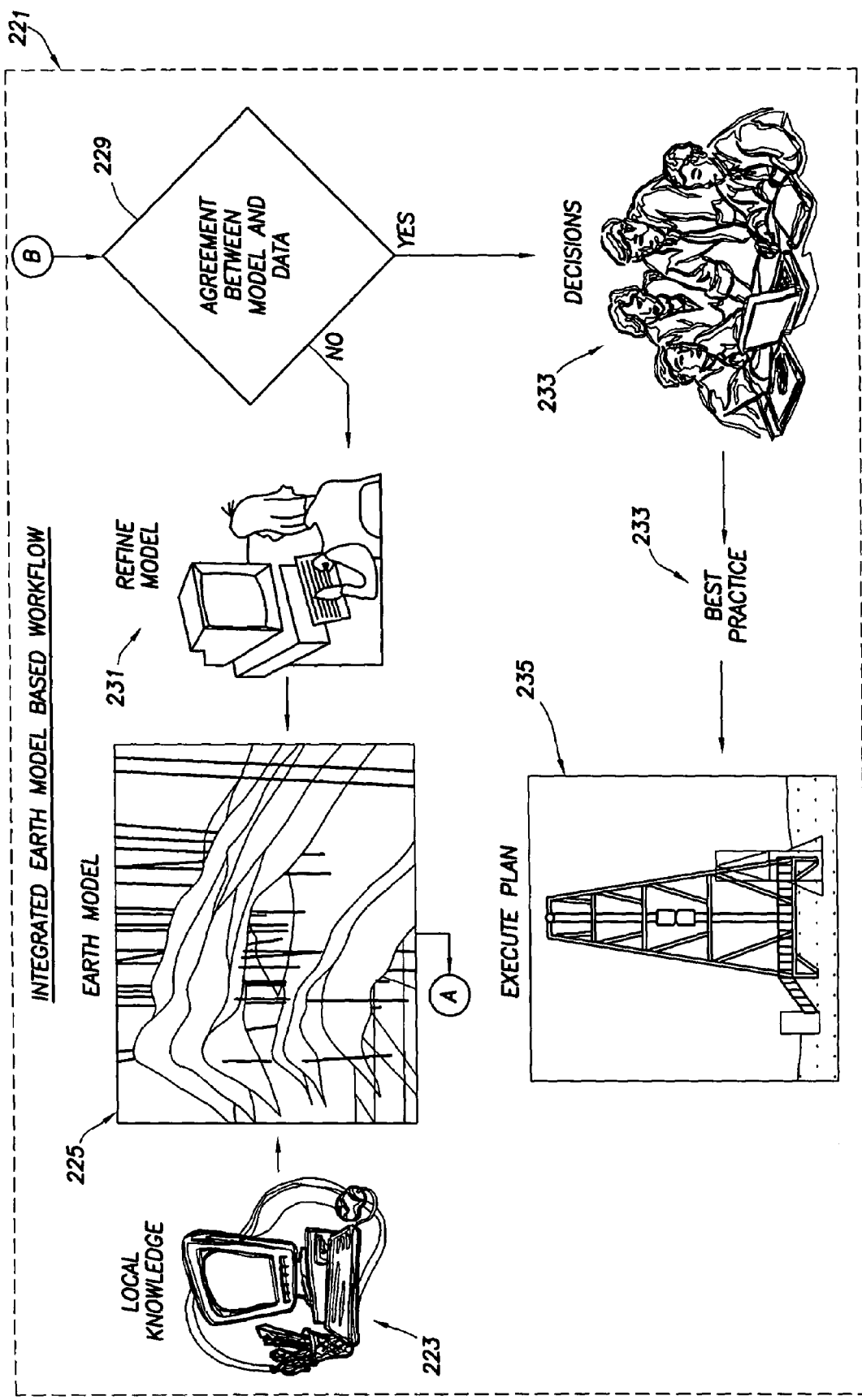

Referring to FIGS. 7A and 7B, an 'Integrated Earth Model (EM) Based Workflow' 221 is illustrated. In FIGS. 7A and 7B, the scientific method or process of FIG. 6B is applied to oilfield operations, and a complete Earth Model (EM), which is adapted to model drilling and completions operations in hydrocarbon reservoirs, supports all types and forms of oilfield simulators. In FIGS. 7A and 7B, the scientific method or process of FIG. 6B as applied to the 'Integrated Earth Model (EM) Based Workflow' 221 of FIGS. 7A and 7B includes the following steps. Local knowledge 223 is acquired. An Earth Model (EM) 225 is built. A plurality of 'individual workflow models' 227 are selected which comprise the 'workflow models' of the EM 225, the 'workflow models' 227 being adapted to 'model drilling and completions operations in hydrocarbon workflows' and 'optimize drilling and completion operations in hydrocarbon reservoirs' by 'characterizing the properties of the reservoir with enough clarity in order to design drilling and completion operations that minimizes the damage to the hydrocarbon reservoir, minimize the damage to the completion pathway, maximize the production rate, and maximize the ultimate recovery of underground deposits of hydrocarbon in the reservoir'. The 'workflow models' 227 include a petrophysics model or simulator 227$a$ adapted for generating a first set of predictions, a drilling model or simulator 227$b$ adapted for generating adapted for generating a second set of predictions, a fracture model or simulator 227$c$ adapted for generating a third set of predictions, and a reservoir simulator 227$d$ adapted for generating a fourth set of predictions. The current best mode of practicing the present invention would be to use a robust fracture model or simulator 227$c$, such as but not limited to a PL3D simulator which can model individual layers and predict fracture geometry and screenouts, such as Schlumberger's Planer3D simulator. In addition to the predictions, a set of 'observations' are also generated, including: a set of logging observations 227$e$, a set of drilling observations 227$f$, a set of completion observations 227$g$, and a set of reservoir observations 227$h$ (hereinafter, the 'observations' are called 'observation data'). A question 229 is asked: Is there agreement between the 'predictions from the model' and the 'observation data'? If 'no', refine the model 231. If 'yes', decisions 233 are made regarding the best practice in regards to the drilling and completion of a hydrocarbon reservoir, and then a 'plan is executed' 235, based on the decisions 233, regarding the drilling and completion of the hydrocarbon reservoir.

Figure 8:
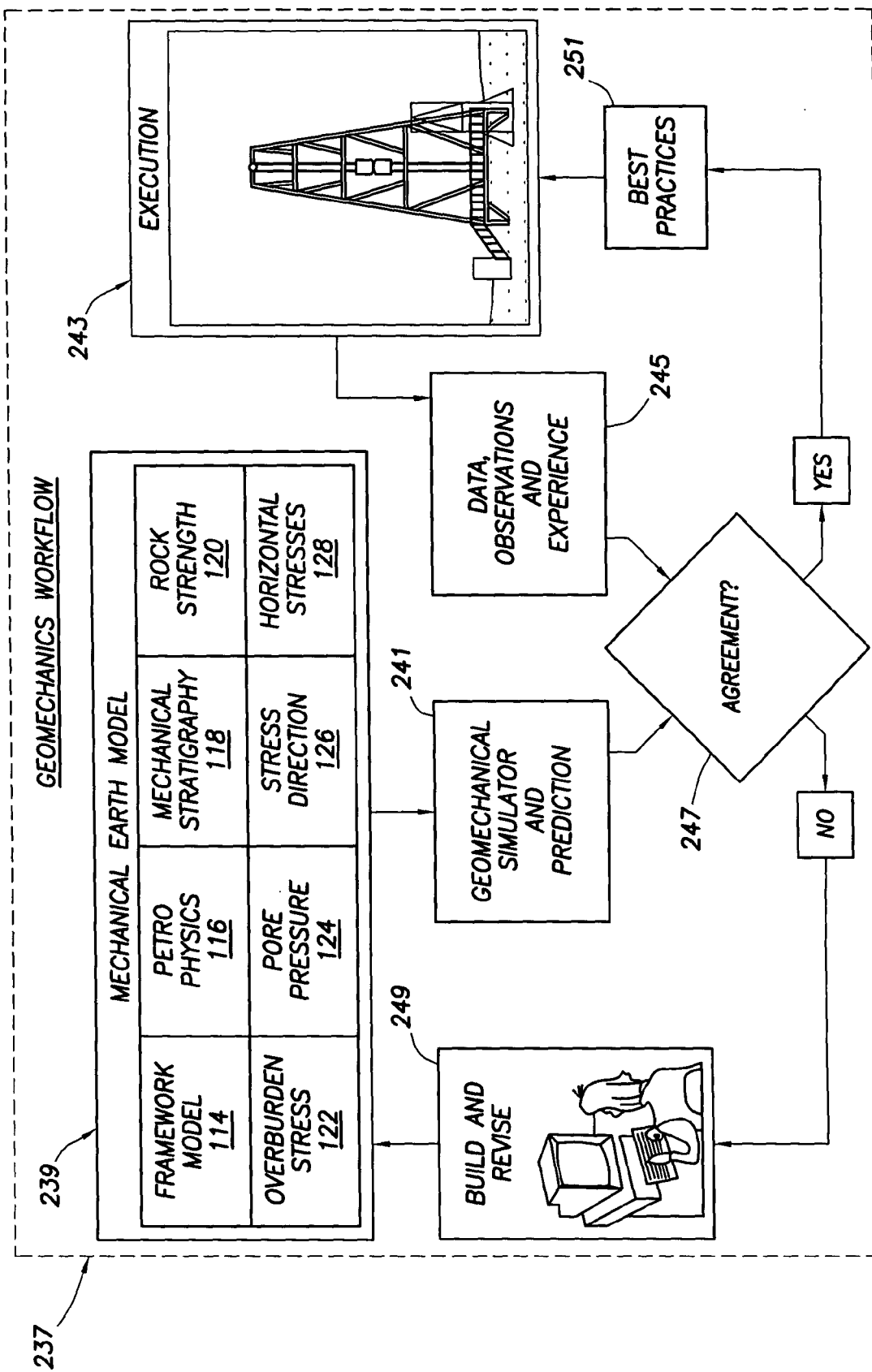
FIG. 8 illustrates an Earth Model (EM) including a Mechanical Earth Model (MEM) adapted for geomechanical simulation.

Referring to FIG. 8, a Geomechanics Workflow 237 is illustrated. In FIG. 8, the Mechanical Earth Model (MEM) component of the EM is fit for any geomechanical simulation. This specification introduces numerous refinements in multiple places in this workflow that improves on the drilling and completion efficiency for hydrocarbon reservoirs. In FIG. 8, a Mechanical Earth Model (MEM) 239 is built which includes a plurality of 'workflow models': a Framework model 114, a Petrophysics model 116, a Mechanical Stratigraphy model 118, a Rock Strength model 120, an Overburden model 122, a Pore Pressure model 124, a Stress Direction model 126, and a Horizontal Stress model 128 (all of which are pursuant to the workflow design of FIG. 3). The MEM 239 will generate 'predictions' 241. A hydrocarbon reservoir 243 will generate data, observations, and experience (i.e., 'observation data'). A question 247 is asked: is there agreement between the 'predictions' and the 'observation data'? If 'no', 'revise the MEM' 249. If 'yes', a set of 'best practices' 251 are acquired with regard to the drilling and completion of the hydrocarbon reservoir 243, and then the 'best practices' (with regard to the drilling and completion of the hydrocarbon reservoir 243) are implemented in the reservoir.

It is not common in the industry to use a complete MEM to design drilling and completion operations. Nor is it common for operators to refine the different components of a MEM based on all the available observations and data. Even if a complete MEM were available, most simulators are based on simplistic models that cannot use the complete mechanical description. For instance, if a hydraulic fracture simulator cannot model a naturally fractured reservoir, then why go to the expense of characterizing the natural fractures for an optimized hydraulic fracture design? This specification discloses a method for integrating the rapidly evolving methods and workflows in individual disciplines into a complete MEM. This complete MEM contains much more information than can be used by most simulators, but is in fact absolutely required to optimize both drilling and completion operations. Having this information readily available allows a drilling or completion engineer to design beyond the capability of currently available simulators and thus improve the drilling and completion designs.

Figure 9:
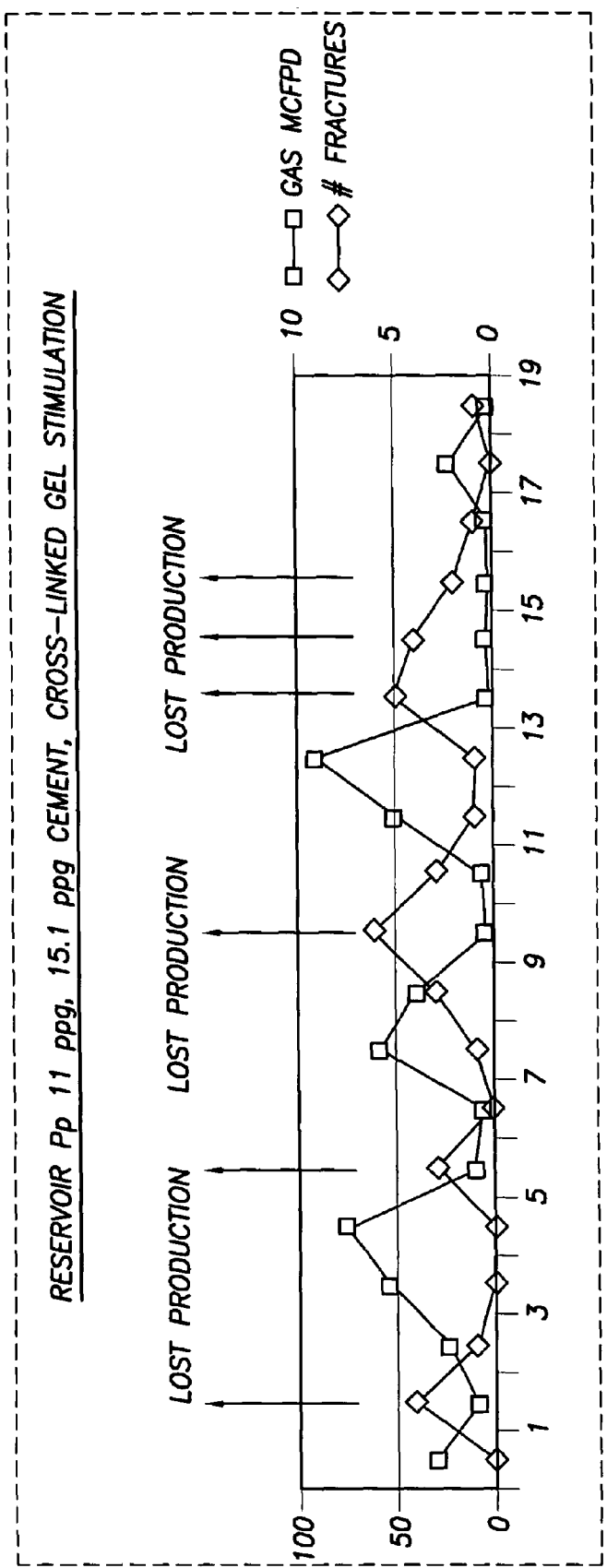
FIG. 9 illustrates an example of damaged natural fractures in a well that has 19 hydraulic fracture stages.

Referring to FIG. 9, the current MEM tends to lack emphasis on the characterization of natural fractures. In fact, the recent Oilfield Review article "Watching Rocks Change—Mechanical Earth Modeling" (already incorporated herein by reference) briefly refers to natural fractures in only two places. FIG. 9 shows a recent example of damaged natural fractures in a well that had 19 hydraulic fracture stages. There is a clear anti-correlation between the number of open natural fractures (ONF) and production as quantified using production logging. Clearly, the ONFs, which should be 1000 times more permeable than the formation, are not significantly contributing to the overall production. It is quite likely that either the drilling, cementing or completion operations damaged the permeability. This specification discloses a workflow that directly addresses this problem as well as many more.

The scientific method of FIG. 8 encourages a workflow of design, execute and evaluate (DEE). The method illustrated in FIG. 8 is responsible for the introduction of new and/or evolving modeling codes, completion materials and techniques, and observational techniques that can help diagnose and evaluate what happened during a drilling or completion operation and/or experiment.

An overview of building a Mechanical Earth Model is given in the "Watching Rocks Change—Mechanical Earth Modeling" Oilfield Review article mentioned previously (already incorporated herein by reference). However, two areas that are "glossed over" in that article include: natural fracture characterization, and building the stress model component of the complete MEM.

Some of the problems associated with building a complete MEM and using it in downstream processing are:
1) Difficulties discriminating acoustical anisotropy caused by fractures with anisotropy caused by in-situ stresses with surface seismic or convention wireline tools.
2) Difficulties differentiating drilling induced fractures (DIF) with open natural fractures (ONF) or ONFs with closed natural fractures (CNF) with wellbore images alone.

3) Difficulties locating ONF with Sonic Scanner data alone.
4) Difficulties determining fracture aperture and permeability using conventional wireline acoustics. This is solved in this specification using the new workflow.
5) Difficulties determining natural fracture spacing when the wellbore is poorly aligned with the natural fractures (NF).
6) Difficulties determining the magnitude of the far-field in-situ stresses.
7) Difficulties determining the magnitude of the maximum horizontal stress. This can be directly measured using a wellbore pressure gauge when the hydraulic fracture stimulation causes aligned natural fractures to open. This situation can be diagnosed using hydraulic fracture monitoring.
8) Difficulties determining the magnitude of the far-field in-situ stresses aligned perpendicular to the wellbore in the presence of open natural fractures.
9) Difficulties modeling hydraulic fractures in the presence of ONF.
10) Understanding what to do when the direction of the stress is different from the ONF.

A complete workflow will be highlighted in this specification and the drilling and completions options will be identified.

The first step in an integrated workflow is to build a 1D MEM using existing information. A MEM contains the necessary data to model and predict geomechanical processes such as wellbore instability, the growth of hydraulic fractures or the collapse of formations due to the production of fluids. All of these processes require as input the intrinsic properties of the formation as well as the extrinsic forces acting on the formation. Additional data is required to validate and calibrate the MEM. The second step is to use the results of the MEM to design and execute any drilling or completion operations. Two completions designs will be discussed in detail: a cementing design and a hydraulic fracture design.

Building the MEM

A Mechanical Earth Model (MEM) has eight components. These components are built in order from the framework model to the horizontal stress magnitude model. The purpose of a MEM is to provide all the necessary inputs to run a geomechanical simulator. The best test of a MEM is to validate the predictions of multiple geomechanical simulators with the observations of a geomechanical process such as the stability of a wellbore and the geometry of a induced hydraulic fracture. MEMs can be anywhere from a 1-D to a fully 3-D model. Additional simulation is required to validate 3D MEMs. The eight components of the MEM are as follows (see FIG. 3).

1) Framework model 114
2) Petrophysical model 116
3) Mechanical stratigraphy model 118
4) Rock strength model 120
5) Overburden model 122
6) Pore Pressure model 124
7) Principal in-situ stress direction 126
8) Horizontal stress magnitude 128

The framework model 114 documents the structure of the reservoir including faults, pinchouts, disconformities and the surfaces of the major formation tops. For a 1-D model, this is simply a description of the stratigraphic column, or formation tops, in true vertical depth. However, a simple 1-D model will never give the geomechanics engineer enough insight or understanding to build a fully 3D model. A fully 3D model is particularly important for 3D stress modeling.

The petrophysical model 116 documents the porosity, lithology/mineralogy, saturation and permeability of the non-fractured reservoir.

The mechanical stratigraphy model 118 documents the properties of the formation between the formation tops. It is important to quantify elastic properties of the intact rock as well as characterize the ONF system. This description differentiates between layers of different mechanical properties. In addition to layers of different lithology, there are boundaries due to contrasting stiffness, like Young's modulus, and boundaries due to contrasting mechanical support. In some facies the matrix supports the overburden and in others, the particles of clay support the overburden. Natural fractures alter the global formation stiffness as well as the effective permeability of the formation. 3-D anisotropy computations are required when dealing with transversely isotropic or orthorhombic symmetry. Inversion algorithm is required to determine the stress-tensor when dealing with anisotropic media. This is of particular importance when considering fractured shale formations where the shale layering contributes to the anisotropy due to the intrinsic nature of the rock. This must be identified when determining the proper shear modulus to use in the MEM.

The rock strength model 120 documents the coefficients that characterize the yield and failure of the formation. While the specific coefficients are model dependent, a minimum characterization includes the Mohr-Coulomb model described by a friction angle and the unconfined compressive strength and the tensile strength of the formation.

The overburden model 122 documents the vertical stress in the earth. The vertical stress is simply the integration of the bulk density of the many layers along a vertical line from the point of interest to the surface of the earth. Deviated or horizontal wells typically require a 2-D or 3-D framework model.

The pore pressure model 124 documents the fluid pressure in the formation. All formations that have porosity have a fluid pressure within the pores. This includes all formations such as sands, carbonates and shales.

The principal in-situ stress directional model 126 documents the direction of the three mutually independent principal stresses. Formations with significant structure require complex stress modeling, such as that achieved with finite element or finite difference analysis. Here the boundary conditions of the reservoir play a critical role in the estimation of the direction of the in-situ stresses acting in the earth.

The horizontal stress model 128 documents the magnitude of the two quasi-horizontal stresses. Again, formations with significant structure require complex stress modeling.

Validation models (geomechanical simulations) insure the accuracy of the MEM. A variety of data is used to validate both the MEM components as well as the geomechanical models predicting the overall geomechanical behavior. For instance, the horizontal stress model 128 is validated when the predicted values are confirmed with a reasonable number of in-situ stress measurements. The wellbore stability validation model is validated when the predicted wellbore instabilities are confirmed with drilling measurements and observations.

Calibration has to do with the engineering problem of adjusting a good measurement, good being defined as a measurement that is sensitive to the property being studied, to accurately reflect the property of interest. Validation has to do with the scientific problem of determining if a measurement is sufficiently sensitive to the property being studied to warrant calibration.

Normally, validation is considered only when calibration data is available. For instance, stress models are typically validated by the goodness of fit between the computed stresses and the measured stresses. While this validation is necessary and important, it is not sufficient. Two models based on totally different physics may accurately predict the stresses in a vertical "calibration" well drilled on the crest of a structure, but only one model predicts accurate stresses on both the crest and the flanks of a structure. Validation implies an understanding of the physics for the numerous sources of stress in the earth as well as the effect these stresses have on the measurements used to infer them. Calibration is important but validation is absolutely critical to both the scientific problem and any business implication.

In-situ measurements of geomechanical processes provide both calibration and validation information. For instance, an analysis of the downhole annular pressure and resistivity measurements acquired during a lost circulation event provides a calibration point for the horizontal stress model. As the number of geomechanical observations increase, constraints are placed on the possible models. Eventually, a model is rejected because it is inconsistent with the geomechanical measurements and observations.

All geomechanical processes can be validated with measurements and observations. Acoustic emission mapping provides a 3-D movie showing the initiation and growth of a hydraulic fracture stimulation. This data can easily show if the minimum horizontal stress magnitude in the sand reservoir is less then the minimum horizontal stress magnitude in the boundary shales.

The data that contributes to a calibrated and validated MEM is highlighted. The workflow for building a typical MEM has five major tasks.

1) Understanding the problems to be solved
2) Conducting a geomechanical data audit
3) Analyzing the available geomechanical data
4) Building and calibrating the MEM
5) Validating the MEM Each of the steps of the workflow for building a typical MEM will be discussed below, as follows.

Understanding the Problem to be Solved

The first step in building a MEM is to understand what problem needs to be solved. Depending on the problem, a subset of the MEM might be all that is required. However, when major or multiple geomechanical problems are presented, a more extensive effort is generally required to build, calibrate and validate the MEM.

Conducting a Geomechanical Data Audit

The second task is to perform a geomechanical data audit.
1) Determine what data is needed to build a MEM
2) Collecting the data
3) Compiling and organizing the data The types of data that contribute to the MEM spans a broad area including seismic data, drilling data, logging data and data from cores. An extensive list is provided in the appendix. Two keys to the success of geomechanics projects have to do with data management. The data collected in the data audit must be quickly and easily accessible. Often projects can include multi-well, multi-run data sets with images that require data process and editing to arrive at a usable form. Original data and processing must be kept online or near-line in case of verification or additional interpretation required at a later date. In addition, data from the geomechanical audit should be synthesized to a key data set for quicker database access and downstream processing. Because these projects often involve large data sets, GeoFrame and/or oracle performance can become an issue. It is often much quicker to move key edited data to a second project for upstream interpretations. Data movement is very quick between projects for any type of data using the Data Manager project data export function. In addition, as the geomechanics projects are supported in multiple locations, having smaller key data sets allows quicker movement across low bandwidth networks Analyzing the Available Geomechanical Data The third task is to analyze the available geomechanical data.

Building, Validating, and Calibrating the MEM

The fourth task is to build, validate and calibrate the MEM. There is potentially a large amount of data to digest while building the mechanical earth model. Normally the seismic data has already been processed. The velocity model is compared with any check shots and the up-scaled wireline sonic logs.

A significant amount of data can be analyzed in GeoFrame. The standard petrophysical logs are always analyzed for a complete formation evaluation. While borehole images may have been analyzed for formation dips, another pass through the data is generally required specifically looking for drilling induced fracturing and breakouts. Analysis of caliper data is also conducted. Sonic waveforms are analyzed in situations where the field processing is suspect.

Drilling data can provide a significant amount of calibration and validation information. The daily drilling reports should be read and the significant drilling events should be highlighted. Major events should be analyzed in detail.

The framework model 114 is constructed from seismic and logging data. The seismic data should include appropriate seismic sections and velocities calibrated from check-shot data. Typical petrophysical logs help identify the major formation tops. Dipmeter logs quantify the formation dip and the location of faults and unconformities.

The petrophysical model 116 is constructed from formation logs and recovered core. It is important to quantify the porosity mineralogy/lithology, saturation, and permeability of the different layers. The petrophysical properties should be validated with standard petrophysical tests conducted on recovered core.

The mechanical stratigraphy model 118 is constructed from the petrophysical model including the acoustical and wellbore imaging logs. An analysis of wellbore images and Sonic Scanner data can solve a host of problems.

The rock strength model 120 is constructed from the petrophysical and mechanical stratigraphy model. When mechanical tests on recovered core are available, the rock strength model is calibrated to the laboratory measurements. When mechanical tests are not available, a correlation is used. Correlations are not universal and an uncertainty analysis should be completed when correlations are used.

The overburden model 122 is constructed by integrating the bulk density log. Missing data in the shallow horizons are typically encountered. This can lead to significant uncertainties. It is thus important to estimate the bulk density in the layers with missing data. Mud logs can help estimate the missing data.

The pore pressure model 124 is constructed using the framework, petrophysical, mechanical stratigraphy and overburden models. The seismic processing needed for pore pressure prediction is different from that needed for the framework model. The processing applied (post-stack time, pre-stack time, post-stack depth, pre-stack depth) and method used to obtain the velocities should be noted as well as who acquired and who processed the data.

The stress models 126 and 128 are constructed using all the previous models. Lost circulation events, leak-off tests and pre-stimulation calibration tests generally provide the best calibrations points.

Validating the MEM

Additional analysis is necessary to validate the MEM. A quick study of the geomechanical process of interest should be conducted to validate the model and determine the sensitivity of the geomechanical process to uncertainties in the MEM.

Cementing Design

The MEM gives a continuous stress profile vs. depth. If during the cementing operations the annular pressure exceeds the fracture gradient, then whole cement will be pumped into an induced hydraulic fracture. If the fracture gradient is lower in the sands than in the shales, then cement will be pumped or gravity pulled into reservoir rock and thus lowering or eliminating the permeability of the completion pathway. The design of the cementing job must not exceed the minimum in-situ stress. The concept of measuring and evaluation cement fall back is a poorly captured data set within industry.

Log derived data that describes the density and aperture of natural fractures adjacent to formations can be applied to optimize the cement placement in the annulus between the steel casing and the formation. In addition the critical pressures that would cause these natural fractures to dilate and start taking completion fluids can be taken into account within the design of the isolation treatment, either by avoiding exceeding this critical pressure or by providing loss circulation materials to bridge and stop excessive losses of cement into the formation. This will both aid in effective zonal isolation and reduce damage to key potential hydrocarbon producing intervals.

Hydraulic Fracture Design

Hydraulic fracturing is a completion technique commonly applied in low permeability formation to stimulate the productive potential to the point of enabling very low permeability formations to produce hydrocarbons at an economic rate. Log derived data that describes the natural fracture density, aperture, and critical dilation pressures can be critical to optimized stimulation completion design. From this log derived information, optimally sized bridging materials can be employed to prevent excessive leakoff into the formation that can cause damage to the natural fracture permeability, and result in a premature termination of the stimulation treatment. Or this log derived information can be used to modify the stimulation treatment to avoid critical pressures where natural fracture dilation would occur.

In addition this log derived information can be instrumental in determining the nature of the fracture stimulation that will occur. This can provide insight to the propensity of elasticly coupled planar fractures or shear slippage fracture systems. This information can be valuable in determining what type of fluids to employ and what type of proppant would be required (if any at all).

Figure 10:
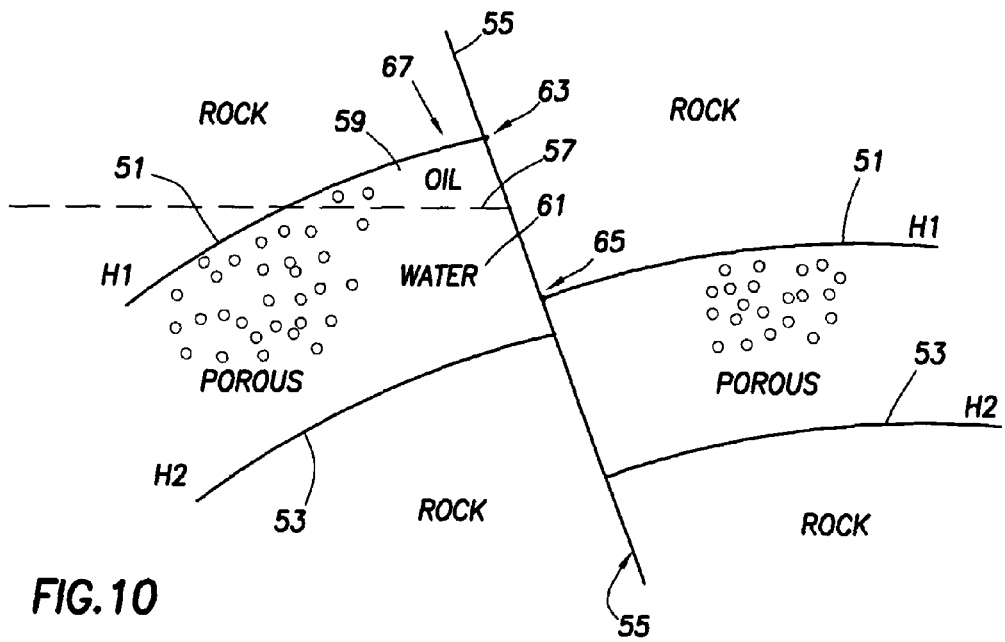
FIGS. 10 and 11 illustrate the ultimate purpose of the above referenced Software stored in the memory of the computer system of FIG. 1 that is adapted for practicing a 'Method for optimizing Drilling and Completions Operations in Hydrocarbon reservoirs'; that is, to extract oil and/or gas from an Earth formation, FIG. 10 illustrating the characteristics of the Earth formation, and FIG. 11 illustrating a drilling rig that is used for extracting the oil and/or gas from the Earth formation of FIG. 10.
Figure 11:
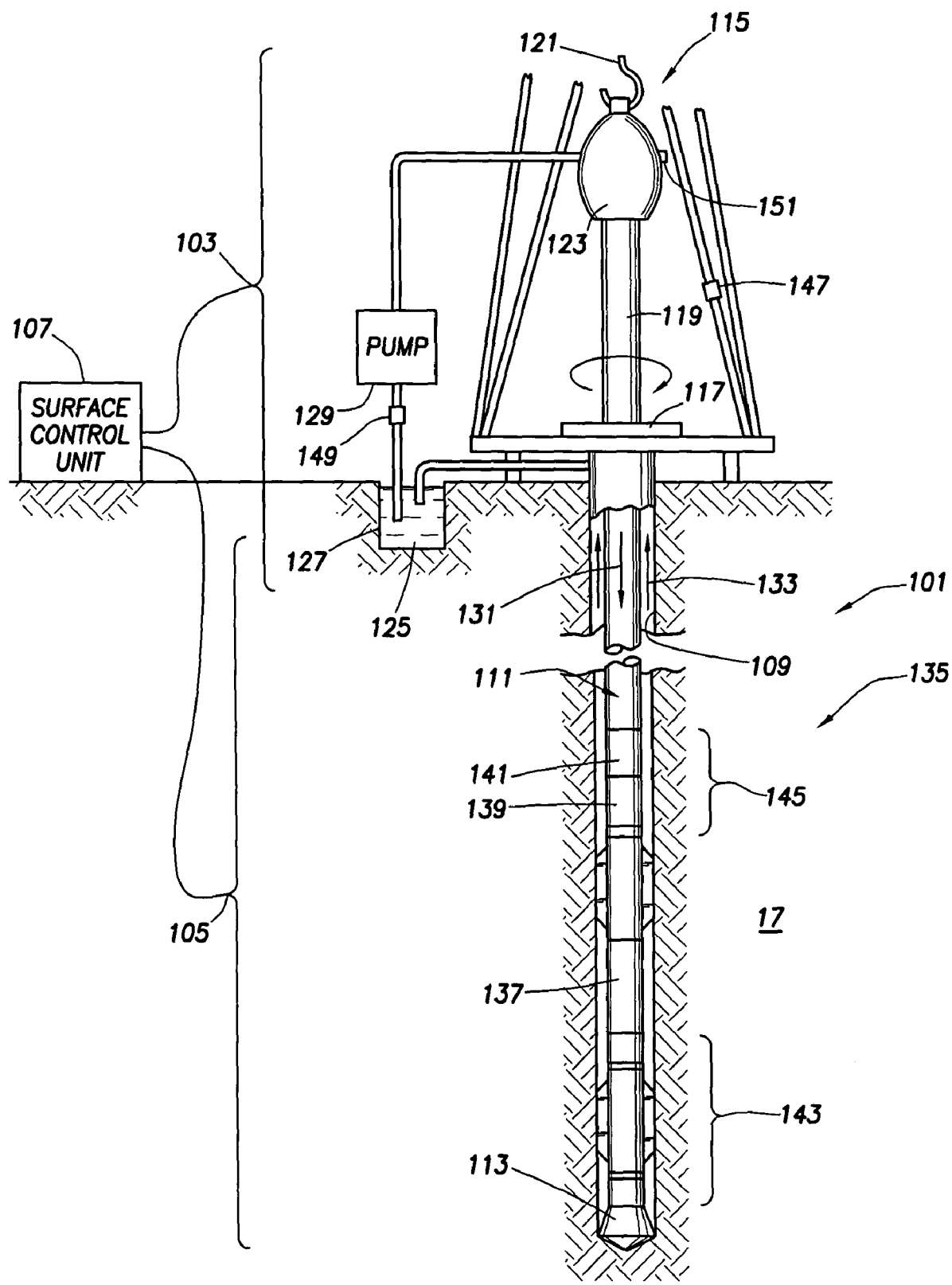

Refer now to FIGS. 10 and 11. These FIGS. 10 and 11 illustrate the ultimate purpose of the above referenced Software 60 of FIG. 1 adapted for 'optimizing drilling and completion operations in hydrocarbon reservoirs' by 'characterizing the properties of the reservoir with enough clarity in order to design drilling and completion operations that minimizes the damage to the hydrocarbon reservoir, minimize the damage to the completion pathway, maximize the production rate, and maximize the ultimate recovery of underground deposits of hydrocarbon in the reservoir'; that is, to extract oil and/or gas from an Earth formation. FIG. 10 illustrates the characteristics of the Earth formation, and FIG. 11 illustrates an drilling rig that can be used for extracting the oil and/or gas from the Earth formation of FIG. 10.

In FIG. 10, a first horizon (H1) 51 and a second horizon (H2) 53 are intersected by the 'fault surface' 55. Now that the 'fault surface' 55 has been defined, it is necessary to interpret a well log output record and the reduced seismic data output record to define the precise location of the 'underground deposits of hydrocarbon' in an Earth formation. For example, in FIG. 10, the 'fault surface' 55 cuts through the first horizon 51 and the second horizon 53 in the Earth formation. A line 57 represents a separation between oil 59 and water 61, the oil 59 and water 61 existing on one side of the 'fault surface' 55. Rock and porous material exists on the other side of the 'fault surface' 55. The 'fault surface' 55 intersects the horizons (H1) 51 and (H2) 53 at two places, a first intersection 63 and a second intersection 65. From FIG. 10, it is evident that oil 59 usually exists near the intersections 63 and 65 between the 'fault surface' 55 and the horizons (H1) 51 and (H2) 53. In order to extract the oil 59 from the Earth formation, it is necessary to drill near the first intersection 63 at point 67.

In FIG. 11, recalling from FIG. 10 that it would be necessary to drill near the first intersection 63 at point 67 in order to extract the oil 59 from the Earth formation, a drilling rig 101 can be placed on the Earth's surface directly above the point 67 of FIG. 10 for the purpose of extracting the oil 59 from the Earth formation. In FIG. 11, an example of that drilling rig 101 is illustrated. The drilling rig 101 is situated above a 'particular location' in the Earth formation (that is, above the point 67 in the Earth's formation of FIG. 10) where the oil and/or gas is potentially located. In FIG. 11, one embodiment of the drilling rig 101 includes a surface system 103, a downhole system 105, and a surface control unit 107. In the illustrated embodiment, a borehole 109 is formed by rotary drilling in a manner that is well known. Those of ordinary skill in the art given the benefit of this disclosure will appreciate, however, that the present invention also finds application in drilling applications other than conventional rotary drilling (e.g., mud-motor based directional drilling), and is not limited to land-based rigs. The downhole system 105 includes a drill string 111 suspended within the borehole 109 with a drill bit 113 at its lower end. The surface system 103 includes the land-based platform and derrick assembly 115 positioned over the borehole 109 penetrating a subsurface formation 17. The assembly 115 includes a rotary table 117, kelly 119, hook 121, and rotary swivel 123. The drill string 111 is rotated by the rotary table 117, energized by means not shown, which engages the kelly 119 at the upper end of the drill string. The drill string 111 is suspended from a hook 121, attached to a traveling block (also not shown), through the kelly 119 and a rotary swivel 123 which permits rotation of the drill string relative to the hook. The surface system further includes drilling fluid or mud 125 stored in a pit 127 formed at the well site. A pump 129 delivers the drilling fluid 125 to the interior of the drill string 111 via a port in the swivel 123, inducing the drilling fluid to flow downwardly through the drill string 111 as indicated by the directional arrow 131. The drilling fluid exits the drill string 111 via ports in the drill bit 113, and then circulates upwardly through the region between the outside of the drill string and the wall of the borehole, called the annulus, as indicated by the directional arrows 133. In this manner, the drilling fluid lubricates the drill bit 113 and carries formation cuttings up to the surface as it is returned to the pit 127 for recirculation. The drill string 111 further includes a bottom hole assembly (BHA), generally referred to as 135, near the drill bit 113 (in other words, within several drill collar lengths from the drill bit). The bottom hole assembly includes capabilities for measuring, processing, and storing information, as well as communicating with the surface. The BHA 135 further includes drill collars 137, 139, and 141 for performing various other measurement functions. Drill collar 137 of BHA 135 includes an apparatus 143 for determining and communicating one or more properties of the formation 17 surrounding borehole 109, such as formation resistivity (or conductivity), natural radiation, density (gamma ray or neutron), and pore pressure. Drill collar 139 houses a measurement-while-drilling (MWD) tool. The MWD tool further includes an apparatus for generating electrical power to the downhole system. While a mud pulse system is depicted with a generator powered by the flow of the drilling fluid 125 that flows through the drill string 111 and the MWD drill collar 141, other power and/or battery systems may be employed. Sensors are located about the wellsite to collect data, preferably in real time, concerning the operation of the wellsite, as well as conditions at the wellsite. For example, monitors, such as cameras 147, may be provided to provide pictures of the operation. Surface sensors or gauges 149 are disposed about the surface systems to provide information about the surface unit, such as standpipe pressure, hookload, depth, surface torque, rotary rpm, among others. Downhole sensors or gauges 151 are disposed about the drilling tool and/or wellbore to provide information about downhole conditions, such as wellbore pressure, weight on bit, torque on bit, direction, inclination, collar rpm, tool temperature, annular temperature and toolface, among others. The information collected by the sensors and cameras is conveyed to the surface system, the downhole system and/or the surface control unit. The MWD tool 141 includes a communication subassembly 145 that communicates with the surface system. The communication subassembly 145 is adapted to send signals to and receive signals from the surface using mud pulse telemetry. The communication subassembly may include, for example, a transmitter that generates a signal, such as an acoustic or electromagnetic signal, which is representative of the measured drilling parameters. The generated signal is received at the surface by transducers, represented by reference numeral 151, that convert the received acoustical signals to electronic signals for further processing, storage, encryption and use according to conventional methods and systems. Communication between the downhole and surface systems is depicted as being mud pulse telemetry, such as the one described in U.S. Pat. No. 5,517,464, assigned to the assignee of the present invention. It will be appreciated by one of skill in the art that a variety of telemetry systems may be employed, such as wired drill pipe, electromagnetic or other known telemetry systems.

Figure 12:
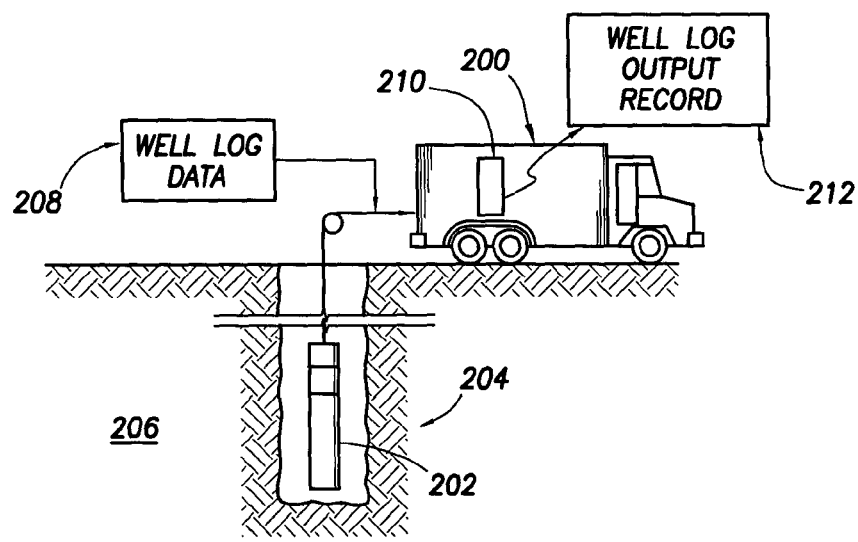
FIGS. 12 and 13 illustrate a method for generating a well log output record.
Figure 13:
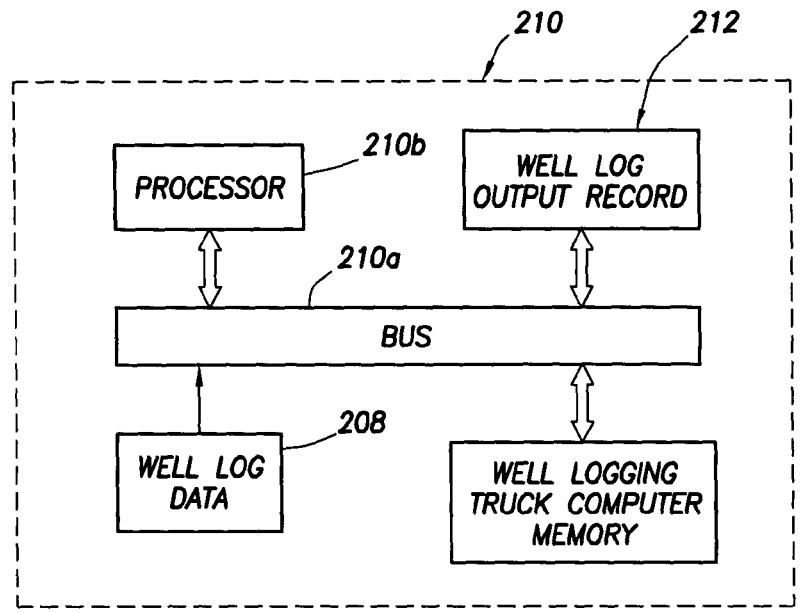
Figure 17:
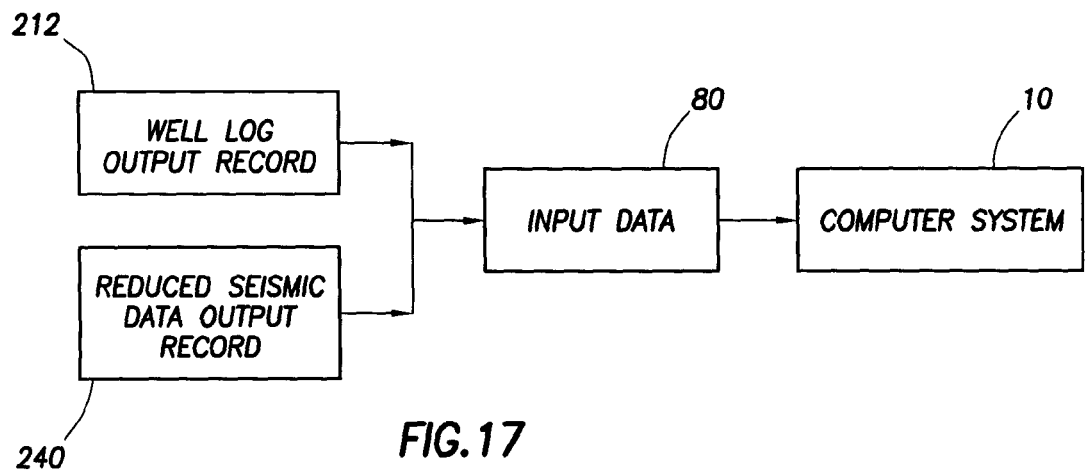
FIG. 17 illustrates how the well log output record and the reduced seismic data output record collectively represent the 'input data' that is input to the computer system of FIG. 1.
Figure 14:
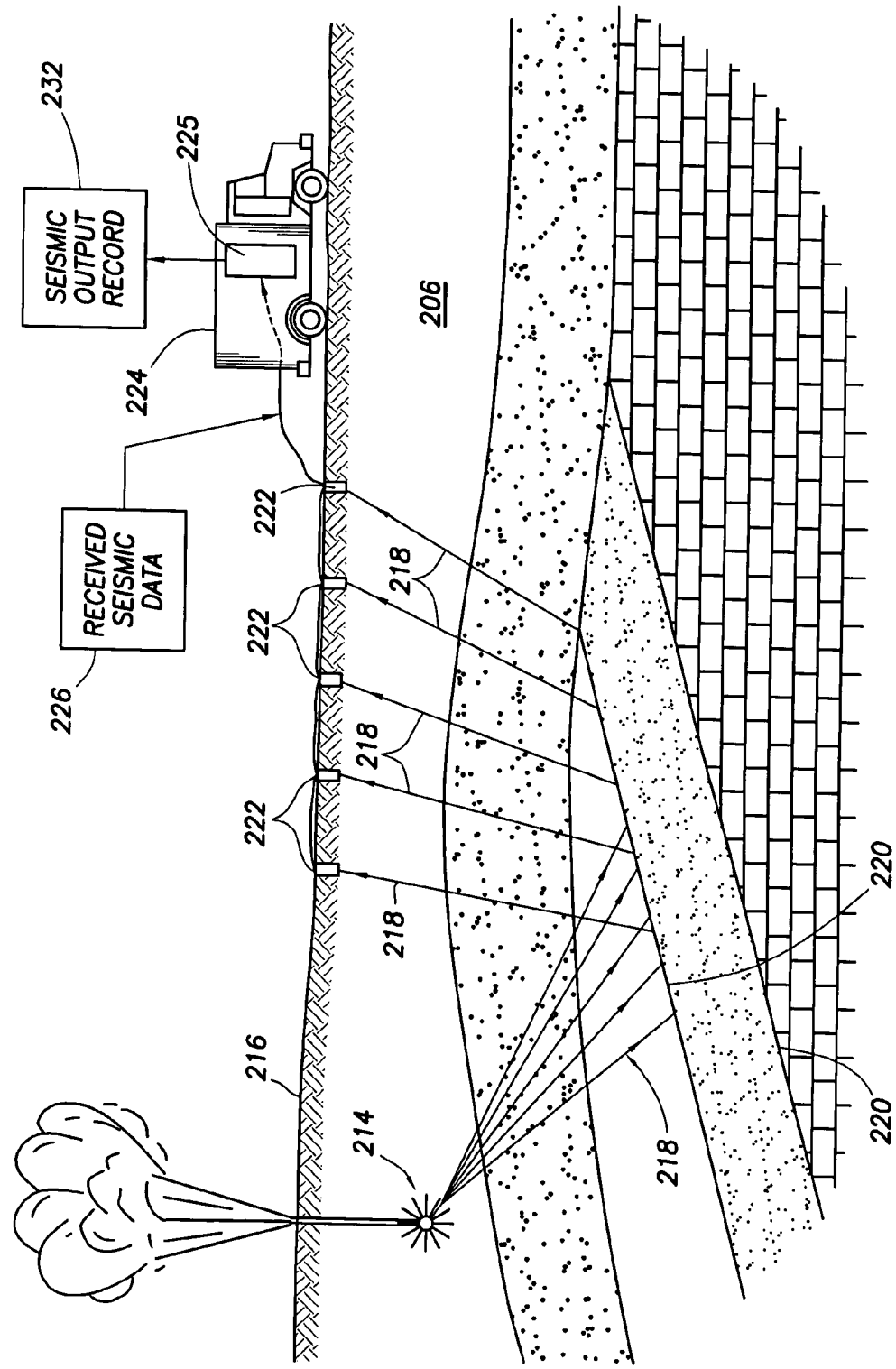
FIGS. 14, 15, and 16 illustrate a method for generating a reduced seismic data output record.
Figure 15:
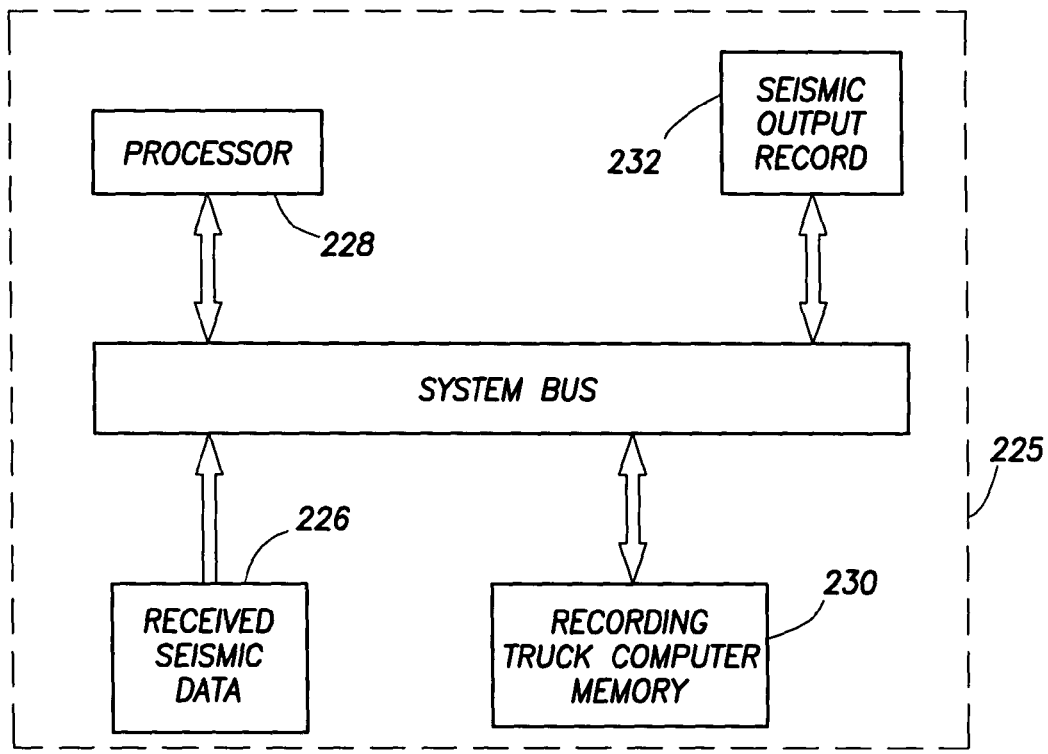
Figure 16:
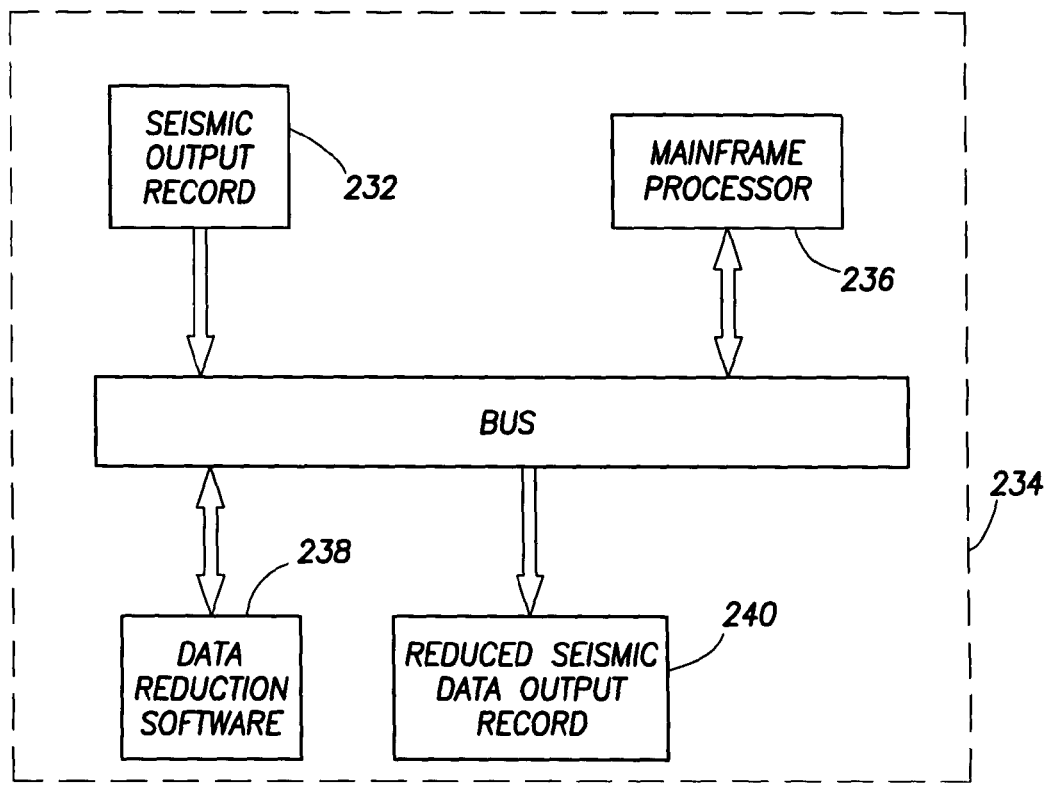

Refer now to FIGS. 12 through 17. Recall from FIG. 1 that 'input data' 80 is provided to the computer system 10 and that the processor 20 executes the 'software' 60 stored in the memory 40 in response to that 'input data' 80. The details of the 'input data' 80 of FIG. 1 that is provided to the computer system 10 will be discussed below with reference to FIGS. 12 through 17 of the drawings. FIGS. 12 and 13 illustrate a method for generating a well log output record. FIGS. 14, 15, and 16 illustrate a method for generating a reduced seismic data output record. FIG. 17 illustrates how the well log output record and the reduced seismic data output record collectively represent the 'input data' 80 that is input to the computer system 10 of FIG. 1.

In FIG. 12, a well logging truck 200 lowers a logging tool 202 into the wellbore 204 and the logging tool 202 stimulates and energizes the Earth formation 206. In response, sensors in the logging tool 202 receive signals from the formation 206, and, in response thereto, other signals representative of well log data 208 propagate uphole from the logging tool 202 to a well logging truck computer 210. A well log output record 212 is generated by the well logging truck computer 210 which displays the well log data 208.

In FIG. 13, a more detailed construction of the well logging truck computer 210 is illustrated. A bus 210a receives the well log data 208 and, responsive thereto, the well log output record 212 is generated by the processor 210b, the well log output record 212 displaying and/or recording the well log data 208. The well log output record 212 is input to the interpretation workstation of FIG. 17.

In FIG. 14, an apparatus and associated method for performing a three dimensional (3D) seismic operation at a location on the earth's surface near the wellbore of FIG. 12 is illustrated.

In FIG. 14, an explosive or acoustic energy source 214 situated below the surface of the earth 216 detonates and generates a plurality of sound or acoustic vibrations 218 which propagate downwardly and reflect off a horizon layer 220 within the Earth formation 206. The horizon layer 220 could be a top layer of rock or sand or shale. When the sound vibrations reflect off the horizon layer 220, the sound vibrations 218 will propagate upwardly and will be received in a plurality of receivers 222 called geophones 222 situated at the surface of the earth. The plurality of geophones 222 will each generate an electrical signal in response to the receipt of a sound vibration therein and a plurality of electrical signals will be generated from the geophones 222, the plurality of signals (referred to as 'received seismic data 226') being received in a recording truck 224. The plurality of electrical signals from the geophones 222 (that is, the 'received seismic data' 226) represent a set of characteristics of the earth formation including the horizons 220 located within the earth below the geophones 222. The recording truck 224 contains a computer 225 which will receive and store the plurality of signals received from the geophones 222. A seismic output record 232 will be generated from the computer 225 in the recording truck 224 which will include and/or display and/or store the plurality of electrical signals that are representative of the characteristics of the earth formation including the horizons 220 located within the earth below the geophones 222.

In FIG. 15, a more detailed construction of the recording truck computer 225 is illustrated. The recording truck computer 225 of FIG. 15 includes a processor 228 and a memory 230 connected to a system bus. The electrical signals, received from the geophones 222 during the 3D seismic operation and referred to as the 'received seismic data' 226, would be received into the recording truck computer 225 via the "Received Seismic Data" block 226 in FIG. 15 and would be stored in the memory 230 of the recording truck computer 225. When desired, a seismic output record 232 is generated by the recording truck computer 225, the seismic output record 232 being adapted for recording and displaying "a plurality of seismic data" representing the 'received seismic data' traces or sets of electrical signals received by the recording truck computer 225 from the geophones 222.

In FIG. 16, a simplified diagram of a mainframe computer 234 is illustrated which uses a stored "data reduction software" to perform a "data reduction" operation on the "plurality of seismic data" included in the seismic output record 232 of FIG. 15. The mainframe computer 234 produces a "reduced seismic data output record" 240 in FIG. 16 which is adapted for recording and displaying information that represents "reduced" versions of the "plurality of seismic data" included in the seismic output record 232 of FIG. 16. The mainframe computer 234 of FIG. 16 includes a mainframe processor 236 connected to a system bus and a memory 238 also connected to the system bus which stores a "data reduction software" therein. The seismic output record 232 of FIG. 15, which includes the "plurality of seismic data", is connected to the system bus of the mainframe computer 234 of FIG. 16. As a result, the "plurality of seismic data", included in the seismic output record 232 of FIG. 16, is now being input to the mainframe processor 236 of FIG. 16. The processor 236 of the mainframe computer 234 in FIG. 16 executes the "data reduction software" stored in the memory 238 of the mainframe computer. The "data reduction software", which is stored in the memory 238 of the mainframe computer 234 of FIG. 16, can be found in a book entitled "Seismic Velocity Analysis and the Convolutional Model", by Enders A. Robinson, the disclosure of which is incorporated by reference into this specification. When the "data reduction software" in memory 238 is executed, the mainframe processor 236 will perform a "data reduction" operation on the "plurality of seismic data" that is included in the seismic output record 232 of FIG. 16. When the "data reduction operation" is complete, the mainframe processor 236 will generate a "reduced seismic data output record" 240 which will record and is adapted for displaying information representing a "reduced version" of the "plurality of seismic data" included in the seismic output record 232 of FIG. 16, and including a set of characteristics pertaining to the earth formation located near the wellbore of FIG. 12, the characteristics including the location and structure of the horizons 220 of FIG. 14.

In FIG. 17, the well log output record 212 of FIG. 12 and the reduced seismic data output record 240 of FIG. 16 collectively and in-combination represent the 'input data' 80 of FIG. 1 that is input to the computer system 10 of FIG. 1.

It will be understood from the foregoing description that various modifications and changes may be made in the preferred and alternative embodiments without departing from its true spirit. For example, other models, parameters, measurements and/or designs may be considered. This description is intended for purposes of illustration only and should not be construed in a limiting sense. The scope of this invention should be determined only by the language of the claims that follow.

We claim:

1. A method of generating a wellsite design, comprising:
designing a workflow for a mechanical Earth Model;
building, using a computer processor, an initial mechanical Earth Model based on said workflow adapted for modeling drilling and completions operations in a hydrocarbon reservoir, wherein said initial mechanical Earth Model includes workflow models comprising a framework model, a petrophysics model, a mechanical stratigraphy model, a rock strength model, an overburden model, a pore pressure model, a stress direction model, and a horizontal stress model;
calibrating each of said workflow models thereby generating a calibrated mechanical Earth Model by:
(a) observing wellsite conditions thereby generating observations for each of said workflow models;
(b) performing simulations to thereby generate predictions for each of said workflow models, wherein said predictions comprise elastic properties of intact rock and a characterization of open natural fractures from said mechanical stratigraphy model;
(c) comparing said observations with said predictions;
(d) accepting said initial mechanical Earth Model, thereby generating a calibrated mechanical Earth Model, on the condition that said observations agree with said predictions;
(e) adjusting each of said workflow models on the condition that said observations do not agree with said predictions; and
(f) repeating steps (b) through (e) until said observations agree with said predictions;
identifying boundaries in said calibrated mechanical Earth Model based on said elastic properties and said characterization of said open natural fractures; and
generating said wellsite design based on said boundaries in said calibrated mechanical Earth Model.

2. The method of claim 1, wherein the workflow models of said initial mechanical Earth Model are operatively interconnected in a particular manner in order to optimize said drilling and completions operations in said hydrocarbon reservoirs.

3. The method of claim 2, wherein the workflow models of said initial mechanical Earth Model optimize said drilling and completions operations in said hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir.

4. The method of claim 1, wherein the step of generating said wellsite design based on said boundaries in said calibrated mechanical Earth Model comprises:
obtaining said calibrated mechanical Earth Model;
defining operating constraints for a wellsite operation; and
designing and generating said wellsite design based on said boundaries in said calibrated mechanical Earth Model and said operating constraints.

5. The method of claim 4, wherein the workflow models of said initial mechanical Earth Model are operatively interconnected in a particular manner in order to optimize said drilling and completions operations in said hydrocarbon reservoirs.

6. The method of claim 5, wherein the workflow models of said initial mechanical Earth Model optimize said drilling and completions operations in said hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir.

7. The method of claim 1, wherein the drilling and completions operations optimized include cementing production casing.

8. The method of claim 1, wherein the drilling and completions operations optimized include stimulating the well.

9. The method of claim 1, wherein the drilling and completions operations optimized include sand management.

10. The method of claim 1, wherein the drilling and completions operations optimized include water management.

11. A non-transitory computer readable medium comprising software instructions for tracing an instrumented program, the software instructions when executed by a computer processor, conducting a process for generating a wellsite design, said process comprising:
designing a workflow for a mechanical Earth Model;
building an initial mechanical Earth Model based on said workflow adapted for modeling drilling and completions operations in a hydrocarbon reservoir, wherein said initial mechanical Earth Model includes workflow models comprising a framework model, a petrophysics model, a mechanical stratigraphy model, a rock strength model, an overburden model, a pore pressure model, a stress direction model, and a horizontal stress model;
calibrating each of said workflow models thereby generating a calibrated mechanical Earth Model by:
(a) observing wellsite conditions thereby generating observations for each of said workflow models;
(b) performing simulations to thereby generate predictions for each of said workflow models, wherein said predictions comprise elastic properties of intact rock and a characterization of open natural fractures from said mechanical stratigraphy model;

(c) comparing said observations with said predictions;

(d) accepting said initial mechanical Earth Model, thereby generating a calibrated mechanical Earth Model, on the condition that said observations agree with said predictions;

(e) adjusting each of said workflow models on the condition that said observations do not agree with said predictions; and (f) repeating steps (b) through (e) until said observations agree with said predictions;

identifying boundaries in said calibrated mechanical Earth Model based on said elastic properties and said characterization of said open natural fractures; and generating said wellsite design based on said boundaries in said calibrated mechanical Earth Model.

12. The non-transitory computer readable medium of claim 11, wherein the workflow models of said initial mechanical Earth Model are operatively interconnected in a particular manner in order to optimize said drilling and completions operations in said hydrocarbon reservoirs.

13. The non-transitory computer readable medium of claim 12, wherein the workflow models of said initial mechanical Earth Model optimize said drilling and completions operations in said hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir.

14. The non-transitory computer readable medium of claim 11, wherein the step of generating said wellsite design based on said boundaries in said calibrated mechanical Earth Model comprises:

obtaining said calibrated mechanical Earth Model;
defining operating constraints for a wellsite operation; and
designing and generating said wellsite design based on aid boundaries in said calibrated mechanical Earth Model and said operating constraints.

15. The non-transitory computer readable medium of claim 14, wherein the workflow models of said initial mechanical Earth Model are operatively interconnected in a particular manner in order to optimize said drilling and completions operations in said hydrocarbon reservoirs.

16. The non-transitory computer readable medium of claim 15, wherein the workflow models of said initial mechanical Earth Model optimize said drilling and completions operations in said hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir.

17. A program storage device readable by a machine tangibly embodying a set of instructions executable by the machine to perform method steps for generating a wellsite design, said method steps comprising:

designing a workflow for a mechanical Earth Model;
building an initial mechanical Earth Model based on said workflow adapted for modeling drilling and completions operations in a hydrocarbon reservoir, wherein said initial mechanical Earth Model includes workflow models comprising a framework model, a petrophysics model, a mechanical stratigraphy model, a rock strength model, an overburden model, a pore pressure model, a stress direction model, and a horizontal stress model;

calibrating each of said workflow models thereby generating a calibrated mechanical Earth Model by:

(a) observing wellsite conditions thereby generating observations for each of said workflow models;

(b) performing simulations to thereby generate predictions for each of said workflow models, wherein said predictions comprise elastic properties of intact rock and a characterization of open natural fractures from said mechanical stratigraphy model;

(c) comparing said observations with said predictions;

(d) accepting said initial mechanical Earth Model, thereby generating a calibrated mechanical Earth Model, on the condition that said observations agree with said predictions;

(e) adjusting each of said workflow models on the condition that said observations do not agree with said predictions; and (f) repeating steps (b) through (e) until said observations agree with said predictions;

identifying boundaries in said calibrated mechanical Earth Model based on said elastic properties and said characterization of said open natural fractures; and generating said wellsite design based on said boundaries in said calibrated mechanical Earth Model.

18. The program storage device of claim 17, wherein the workflow models of said initial mechanical Earth Model are operatively interconnected in a particular manner in order to optimize said drilling and completions operations in said hydrocarbon reservoirs.

19. The program storage device of claim 18, wherein the workflow models of said initial mechanical Earth Model optimize said drilling and completions operations in said hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir.

20. The program storage device of claim 17, wherein the step of generating said wellsite design based on said boundaries in said calibrated mechanical Earth Model comprises:

obtaining said calibrated mechanical Earth Model;
defining operating constraints for a wellsite operation; and
designing and generating said wellsite design based on said boundaries in said calibrated mechanical Earth Model and said operating constraints.

21. The program storage device of claim 20, wherein the workflow models of said initial mechanical Earth Model are operatively interconnected in a particular manner in order to optimize said drilling and completions operations in said hydrocarbon reservoirs.

22. The program storage device of claim 21, wherein the workflow models of said initial mechanical Earth Model optimize said drilling and completions operations in said hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir.

23. A method of generating a wellsite design, said wellsite design relating to a drilling and completions operation in a hydrocarbon reservoir, comprising:

designing a workflow for a mechanical Earth Model;
building an initial mechanical Earth Model based on said workflow, said initial Earth Model including workflow models, the workflow models of said initial mechanical Earth Model being operatively interconnected in a particular manner in order to optimize said drilling and completions operation in said hydrocarbon reservoirs, the workflow models of said initial mechanical Earth Model optimizing said drilling and completions operations in said hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir;

calibrating each of said workflow models thereby generating a calibrated mechanical Earth Model, the calibrating step including,
 (a) observing wellsite conditions thereby generating observations for each of said workflow models,
 (b) performing simulations to thereby generate predictions for each of said workflow models, wherein said predictions comprise elastic properties of intact rock and a characterization of open natural fractures from a mechanical stratigraphy model,
 (c) comparing said observations with said predictions,
 (d) accepting said initial mechanical Earth Model, thereby generating a calibrated mechanical Earth Model, on the condition that said observations agree with said predictions,
 (e) adjusting each of said workflow models on the condition that said observations do not agree with said predictions, and
 (f) repeating steps (b) through (e) until said observations agree with said predictions;

identifying boundaries in said calibrated mechanical Earth Model based on said elastic properties and said characterization of said open natural fractures; and generating said wellsite design based on said boundaries in said calibrated mechanical Earth Model, the step of generating said wellsite design including obtaining said calibrated mechanical Earth Model, defining operating constraints for a wellsite operation, and designing and generating said wellsite design using said calibrated mechanical Earth Model and said operating constraints, wherein the workflow models comprise a framework model, a petrophysics model, said mechanical stratigraphy model, a rock strength model, an overburden model, a pore pressure model, a stress direction model, and a horizontal stress model.

24. A non-transitory computer readable medium comprising software instructions for tracing an instrumented program, the software instructions when executed by a computer processor, conducting a process for generating a wellsite design, said wellsite design relating to a drilling and completions operation in a hydrocarbon reservoir, said process comprising:

designing a workflow for a mechanical Earth Model;

building an initial mechanical Earth Model based on said workflow, said initial mechanical Earth Model including workflow models, the workflow models of said initial mechanical Earth Model being operatively interconnected in a particular manner in order to optimize said drilling and completions operation in said hydrocarbon reservoirs, the workflow models of said initial mechanical Earth Model optimizing said drilling and completions operations in said hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir;

calibrating each of said workflow models thereby generating a calibrated mechanical Earth Model, the calibrating step including,
 (a) observing wellsite conditions thereby generating observations for each of said workflow models,
 (b) performing simulations to thereby generate predictions for each of said workflow models, wherein said predictions comprise elastic properties of intact rock and a characterization of open natural fractures from a mechanical stratigraphy model,
 (c) comparing said observations with said predictions,
 (d) accepting said initial mechanical Earth Model, thereby generating a calibrated mechanical Earth Model, on the condition that said observations agree with said predictions,
 (e) adjusting each of said workflow models on the condition that said observations do not agree with said predictions, and
 (f) repeating steps (b) through (e) until said observations agree with said predictions;

identifying boundaries in said calibrated mechanical Earth Model based on said elastic properties and said characterization of said open natural fractures; and generating said wellsite design based on said boundaries in said calibrated mechanical Earth Model, the step of generating said wellsite design including obtaining said calibrated mechanical Earth Model, defining operating constraints for a wellsite operation, and designing and generating said wellsite design using said calibrated mechanical Earth Model and said operating constraints, wherein the workflow models comprise a framework model, a petrophysics model, said mechanical stratigraphy model, a rock strength model, an overburden model, a pore pressure model, a stress direction model, and a horizontal stress model.

25. A system adapted for generating a wellsite design, comprising:

a computer processor;

apparatus adapted for designing a workflow for a mechanical Earth Model;

apparatus adapted for building an initial mechanical Earth Model based on said workflow, said initial Earth Model being adapted for modeling drilling and completions operations in a hydrocarbon reservoir, wherein said initial mechanical Earth Model includes workflow models comprising a framework model, a petrophysics model, a mechanical stratigraphy model, a rock strength model, an overburden model, a pore pressure model, a stress direction model, and a horizontal stress model;

apparatus adapted for calibrating each of said workflow models thereby generating a calibrated mechanical Earth Model by:
 (a) observing wellsite conditions thereby generating observations for each of said workflow models;
 (b) performing simulations to thereby generate predictions for each of said workflow models, wherein said predictions comprise elastic properties of intact rock and a characterization of open natural fractures from said mechanical stratigraphy model;
 (c) comparing said observations with said predictions;
 (d) accepting said initial mechanical Earth Model, thereby generating a calibrated mechanical Earth Model, on the condition that said observations agree with said predictions;
 (e) adjusting each of said workflow models on the condition that said observations do not agree with said predictions; and (f) repeating steps (b) through (e) until said observations agree with said predictions;

apparatus adapted for identifying boundaries in said calibrated mechanical Earth Model based on said elastic properties and said characterization of said open natural fractures; and apparatus adapted for generating said wellsite design based on said boundaries in said calibrated mechanical Earth Model.

26. A system adapted for generating a wellsite design, said wellsite design relating to a drilling and completions operation in a hydrocarbon reservoir, comprising:

a computer processor;

apparatus adapted for designing a workflow for a mechanical Earth Model;

apparatus adapted for building an initial mechanical Earth Model based on said workflow, said initial Earth Model including workflow models, the workflow models of said initial mechanical Earth Model being operatively interconnected in a particular manner in order to optimize said drilling and completions operation in said hydrocarbon reservoirs, the workflow models of said initial mechanical Earth Model optimizing said drilling and completions operations in said hydrocarbon reservoirs by minimizing a damage to the hydrocarbon reservoir, minimizing a damage to a completion pathway, maximizing a production rate, and maximizing an ultimate recovery of underground deposits of hydrocarbon from the reservoir;

calibrating apparatus adapted for calibrating each of said workflow models thereby generating a calibrated mechanical Earth Model, the calibrating step including, (a) observing wellsite conditions thereby generating observations for each of said workflow models, (b) performing simulations to thereby generate predictions for each of said workflow models, wherein said predictions comprise elastic properties of intact rock and a characterization of open natural fractures from a mechanical stratigraphy model, (c) comparing said observations with said predictions, (d) accepting said initial mechanical Earth Model, thereby generating a calibrated mechanical Earth Model, on the condition that said observations agree with said predictions, (e) adjusting each of said workflow models on the condition that said observations do not agree with said predictions, and (f) repeating steps (b) through (e) until said observations agree with said predictions;

identifying apparatus adapted for identifying boundaries in said calibrated mechanical Earth Model based on said elastic properties and said characterization of said open natural fractures; and generating apparatus adapted for generating said wellsite design based on said boundaries in said calibrated mechanical Earth Model, the step of generating said wellsite design including obtaining said calibrated mechanical Earth Model, defining operating constraints for a wellsite operation, and designing and generating said wellsite design using said calibrated mechanical Earth Model and said operating constraints, wherein the workflow models comprise a framework model, a petrophysics model, said mechanical stratigraphy model, a rock strength model, an overburden model, a pore pressure model, a stress direction model, and a horizontal stress model.

* * * * *